United States Patent
Yanagita et al.

(10) Patent No.: US 8,604,408 B2
(45) Date of Patent: Dec. 10, 2013

(54) SOLID-STATE IMAGING DEVICE, METHOD OF MANUFACTURING THE SAME, AND ELECTRONIC APPARATUS

(75) Inventors: Takeshi Yanagita, Tokyo (JP);
Fumihiko Koga, Kanagawa (JP);
Toshifumi Wakano, Kanagawa (JP);
Takashi Nagano, Kanagawa (JP)

(73) Assignee: Sony Corporation (JP)

( * ) Notice: Subject to any disclaimer, the term of this patent is extended or adjusted under 35 U.S.C. 154(b) by 384 days.

(21) Appl. No.: 12/944,162

(22) Filed: Nov. 11, 2010

(65) Prior Publication Data
US 2011/0127408 A1    Jun. 2, 2011

(30) Foreign Application Priority Data
Nov. 30, 2009  (JP) .................. 2009-272440

(51) Int. Cl.
*H01L 31/00* (2006.01)
*H01L 27/146* (2006.01)

(52) U.S. Cl.
USPC ........................ 250/214.1; 257/446

(58) Field of Classification Search
USPC ........................ 250/214.1; 257/446
See application file for complete search history.

(56) References Cited

U.S. PATENT DOCUMENTS

| | | | | |
|---|---|---|---|---|
| 5,668,390 | A | * | 9/1997 | Morimoto ............ 257/232 |
| 2007/0210239 | A1 | * | 9/2007 | Lee et al. ............ 250/208.1 |
| 2010/0118167 | A1 | * | 5/2010 | Johnson ............ 348/294 |

FOREIGN PATENT DOCUMENTS

| JP | 2003-031785 | 1/2003 |
|---|---|---|
| JP | 2006-054276 | 2/2006 |
| JP | 2008-205022 | 9/2008 |
| JP | 2008-294218 | 12/2008 |
| JP | 2009-016810 | 1/2009 |

* cited by examiner

*Primary Examiner* — Thanh Luu
(74) *Attorney, Agent, or Firm* — Sheridan Ross P.C.

(57) ABSTRACT

A solid-state imaging device includes: a pixel having a photodiode and a pixel transistor; a first isolation region using a semiconductor region containing impurities formed between neighboring photodiodes; and a second isolation region using an semiconductor region containing impurities formed between the photodiode and the pixel transistor, wherein an impurity concentration of the first isolation region is different from an impurity concentration of the second isolation region.

14 Claims, 24 Drawing Sheets

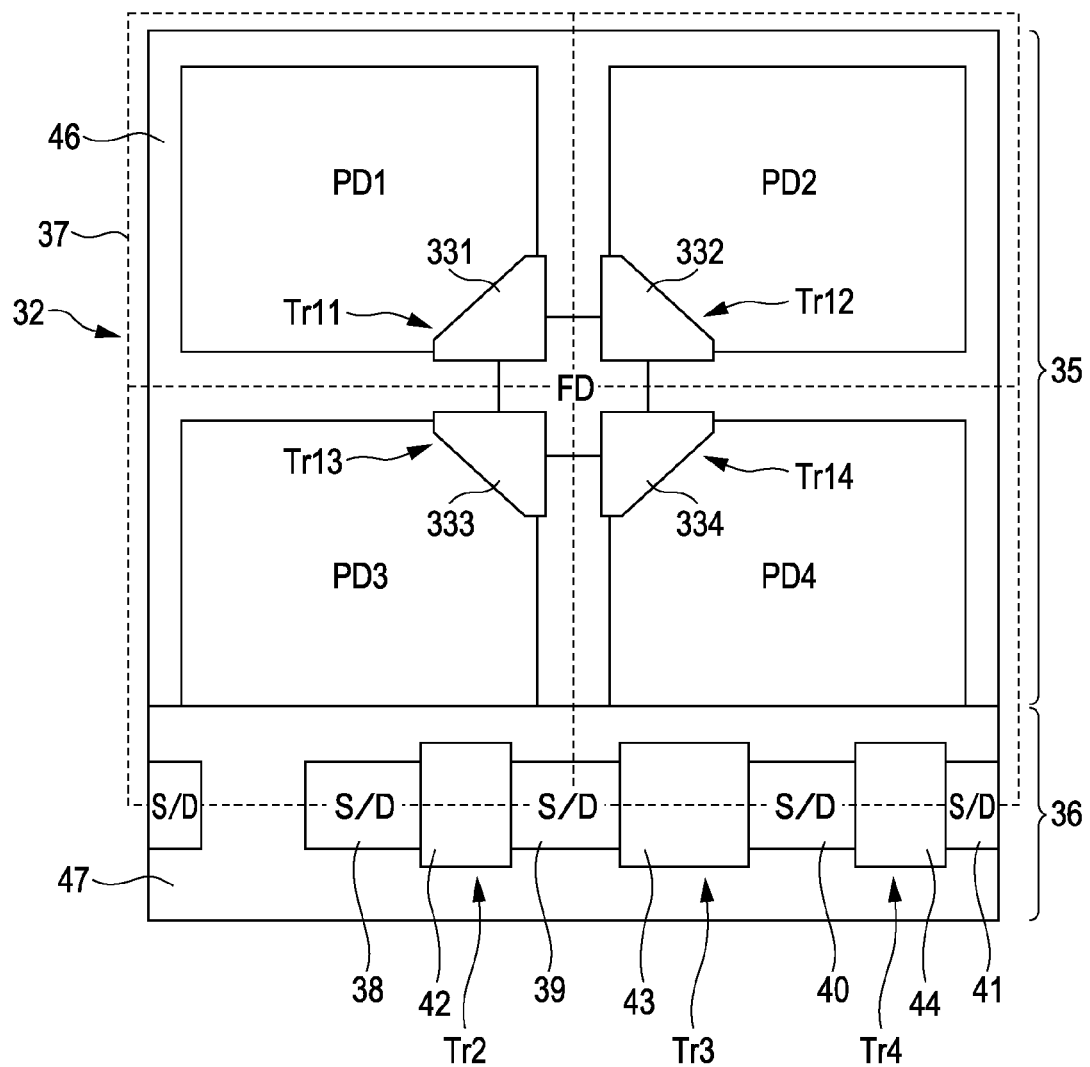

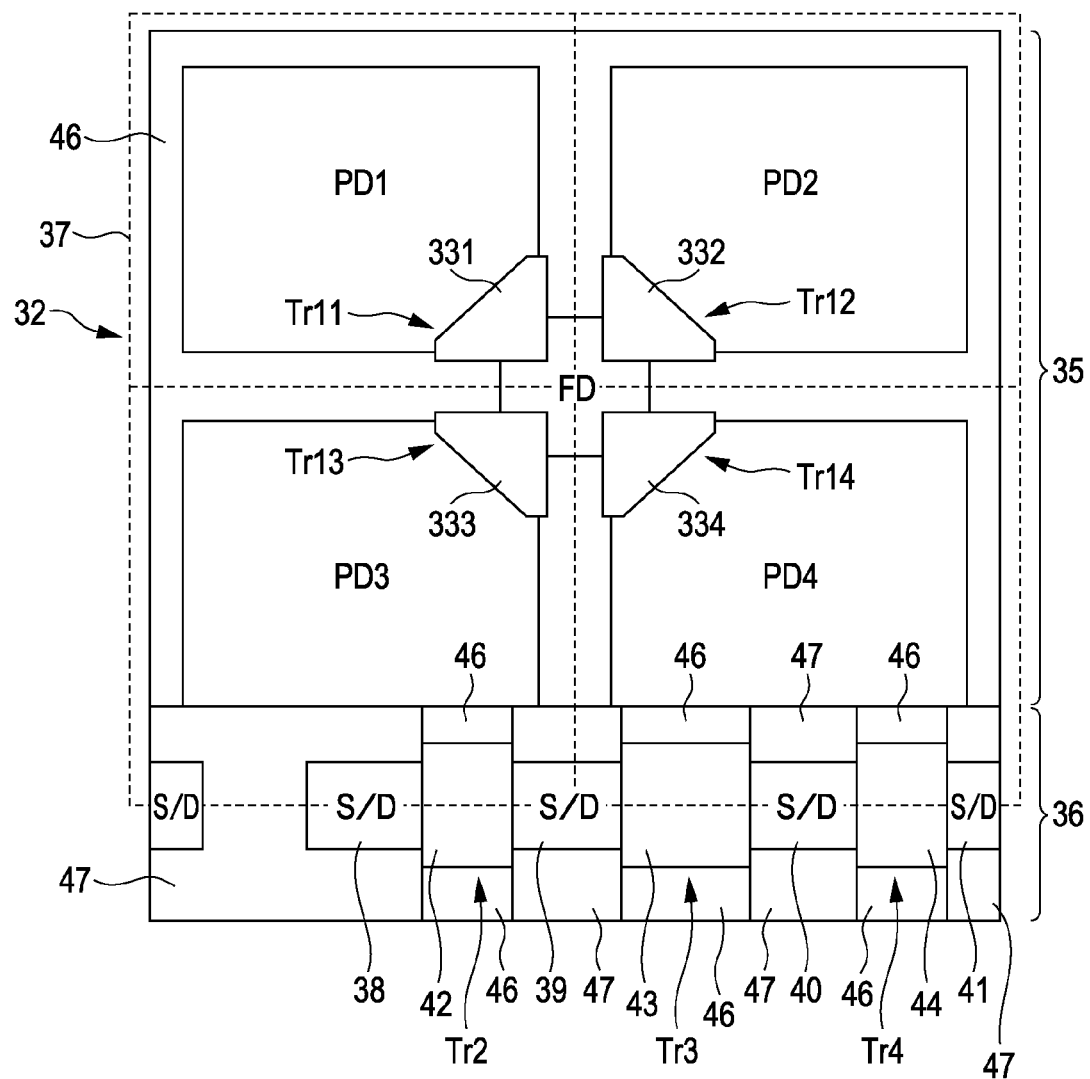

SOLID-STATE IMAGING DEVICE, METHOD OF MANUFACTURING THE SAME, AND ELECTRONIC APPARATUS

BACKGROUND OF THE INVENTION

1. Field of the Invention

The present invention relates to a solid-state imaging device, a method of manufacturing the same, and an electronic apparatus where the solid-state imaging device is applied to a camera or the like.

2. Description of the Related Art

As a solid-state imaging device, a CMOS solid-state imaging device, a CCD solid-state imaging device, or the like are used. Particularly, since the CMOS solid-state imaging device has a low power source voltage and low power consumption, it is employed in a digital still camera, a digital video camera, and various mobile terminal devices such as a mobile phone with a built-in camera.

For example, the CMOS solid-state imaging device includes a pixel portion where photodiodes which are a photoelectric conversion portion and a plurality of pixels having a plurality of pixel transistors are regularly arranged in two dimensions and a peripheral circuit portion disposed around the pixel portion. As the plurality of pixel transistors, for example, a three-transistor structure including a transfer transistor, a reset transistor, and an amplification transistor or a four-transistor structure with a selection transistor added is used.

A typical CMOS solid-state imaging device is constructed by arranging a plurality of unit pixels, each unit pixel including a single photodiode and a plurality of pixel transistors as a group. Recently, as the number of pixels increases, and the pixels become finer, in order to widen the area of the photodiode by reducing the number of pixel transistors per unit pixel, a so-called pixel sharing CMOS solid-state imaging device has been developed where the pixel transistor is shared among a plurality of pixels (refer to Japanese Unexamined Patent Application Publication Nos. 2008-294218 and 2006-54276). In addition, in order to widen the area of the photodiode, a back-side illumination type CMOS solid-state imaging device has been developed where the back face of the substrate opposite to the side where a wire line layer is arranged is used as a light incident face (refer to Japanese Unexamined Patent Application Publication No. 2003-31785).

Further, the CMOS solid-state imaging device includes an isolation region for isolating each pixel or an element within the pixel. For example, it is known that an isolation region using an STI (Shallow Trench Isolation) structure or an impurity semiconductor layer separates the photodiodes in the periphery of the pixel transistor for isolation (refer to Japanese Unexamined Patent Application Publication Nos. 2009-16810 and 2008-205022).

SUMMARY OF THE INVENTION

In the CMOS solid-state imaging device, as the number of pixel increases, and the pixels become finer, the isolation region area for isolating each pixel increases. Therefore, it may not be possible to obtain a sufficient area for the photodiodes, and it is difficult to obtain a sufficient saturation characteristic (saturation charge amount Qs). For example, the source/drain region of the pixel transistor is formed of an n-type semiconductor region having a high concentration of impurities. For this reason, in the case where the isolation region formed of a p-type semiconductor layer is used to isolate the periphery of the pixel transistor including isolation between the source/drain region and photodiode, it is necessary to increase an impurity concentration in the p-type semiconductor layer used for isolation. Typically, the isolation region is formed by collectively implanting ions in a high concentration onto the area including the periphery of the pixel transistor and between the photodiodes. That is, the impurity concentration of the isolation region is rate-controlled by a high impurity concentration of the isolation region around the pixel transistor.

Therefore, when the isolation region is formed of the p-type semiconductor layer having a high concentration, the influence of the diffusion of the p-type impurities of the isolation region toward the photodiode results in an effective area of the photodiode being reduced and the saturation signal amount Qs being reduced. In addition, in the floating diffusion (FD) region, the floating diffusion region having a high concentration adjoins the isolation region having a high concentration so that a high concentration p-n junction is formed. Therefore, the electric field intensity of the p-n junction portion increases, and the white spots in the floating diffusion region worsen. When the electric field is strong and there is a crystal defect, the crystal defect growth rate accelerates, and it is easier for electrons to escape even from a deep level, so that the white spots worsen.

At the same time, since the p-n junction capacity between the floating diffusion region and the isolation region increases, conversion efficiency is degraded.

In addition, in the case where the element isolation structure is changed within the layout of the pixel portion in consideration of imaging characteristics such as random noise reduction, an optimal impurity concentration is not obtained for each element isolation structure, and this incurs losses in a saturation characteristic, sensitivity, and mixed color. Here, a mixture of the isolation region using a STI structure and the isolation region using an impurity semiconductor layer is provided. In the case where ions are collectively implanted, although the isolation concentration can be reduced in the isolation region having the STI structure, optimization is not obtained because a high concentration implantation is to be performed.

In regard to the saturation characteristic and the sensitivity, as the area and the volume of the photodiode are reduced due to high concentration isolation region, the saturation characteristic and the sensitivity decrease. In regard to the mixed color, the width of the isolation region increases due to the high concentration isolation region, and the electric charges photoelectrically converted from the light incident to the isolation region unstably invade the photodiode so that mixed color is generated.

The present invention addresses the above-identified problems and provides a solid-state imaging device and a method of manufacturing the same, by which at least a pixel characteristic such as the saturation characteristic, sensitivity, and mixed color can be improved.

The present invention can be employed in an electronic apparatus where the aforementioned solid-state imaging device is applied to a camera or the like.

The solid-state imaging device according to an embodiment of the present invention includes a pixel including a photodiode and a pixel transistor. In addition, according to an embodiment of the present invention, the first isolation region made of a semiconductor region containing impurities is formed between the neighboring photodiodes, and the second isolation region made of a semiconductor region containing impurities is formed between the photodiode and the pixel transistor. In addition, the impurity concentration of the first isolation region is different from the impurity concentration of the second isolation region.

In the solid-state imaging device according to an embodiment of the invention, since the impurity concentration of the first isolation region is different from the impurity concentration of the second isolation region, the impurity concentration of each isolation region can be set to an optimal concentration. Particularly, since the concentration of the first isolation region between the neighboring photodiodes can be set to a low concentration which is optimal to obtain sufficient isolation, it is possible to increase the area of the photodiode. It is possible to reduce the width of the first isolation region between the neighboring photodiodes.

A method of manufacturing the solid-state imaging device according to an embodiment of the present invention includes a process of forming a pixel including a photodiode and a pixel transistor, and a process of forming the first isolation region using a semiconductor region containing impurities between the neighboring photodiodes. In addition, the method according to an embodiment of the present invention includes a process of forming the second isolation region having a different impurity concentration from that of the first isolation region between the photodiode and the pixel transistor.

The method of manufacturing the solid-state imaging device according to an embodiment of the present invention includes a process of forming the first isolation region between the neighboring photodiodes and the second isolation region between the photodiode and the pixel transistor, in which the impurity concentrations are different from each other. As a result, particularly, since the concentration of the first isolation region between the neighboring photodiodes can be a low concentration which is optimal to obtain sufficient isolation, it is possible to form the photodiode having a large area. Since diffusion of the impurities of the first isolation region toward the photodiode side is suppressed, it is possible to form the first isolation region having a narrow width.

The electronic apparatus according to an embodiment of the present invention includes a solid-state imaging device, an optical system that guides incident light to the photodiode of the solid-state imaging device, and a signal processing circuit that processes an output signal of the solid-state imaging device. The solid-state imaging device is constructed of the solid-state imaging device according to an embodiment of the present invention.

In the electronic apparatus according to an embodiment of the present invention, in regard to the solid-state imaging device, since the impurity concentration is different between the first and second isolation regions of the solid-state imaging device, it is possible to set the impurity concentrations of each isolation region to an optimal concentration. Particularly, since the concentration of the first isolation region between the neighboring photodiodes can be set to a low concentration which is optimal to obtain sufficient isolation, it is possible to increase the area of the photodiode. It is possible to reduce the width of the first isolation region between the neighboring photodiodes.

In the solid-state imaging device according to an embodiment of the present invention, the area of the photodiode increases, and the width of the first isolation region is reduced. Therefore, even when the number of pixels increases and the pixel becomes finer, it is possible to at least improve pixel characteristics such as a saturation characteristic, sensitivity, and mixed color.

In the method of manufacturing the solid-state imaging device according to an embodiment of the present invention, the photodiode with a wide area is formed and the first isolation region with a narrow width is formed. Therefore, even when the number of pixels increases or the pixel becomes finer, it is possible to manufacture the solid-state imaging device at least having improved pixel characteristics such as a saturation characteristic, sensitivity, and mixed color.

In the electronic apparatus according to an embodiment of the present invention, it is possible to at least improve pixel characteristics such as a saturation characteristic, sensitivity, and mixed color of the solid-state imaging device by providing the solid-state imaging device as described above. Therefore, it is possible to provide a high-quality electronic apparatus having an improved image quality.

BRIEF DESCRIPTION OF THE DRAWINGS

FIG. 7 is a schematic diagram illustrating main components of the solid-state imaging device according to a second embodiment of the present invention;

FIG. 8 is a schematic diagram illustrating main components of the solid-state imaging device according to a third embodiment of the present invention;

FIGS. 14A to 14D are process cross-sectional views illustrating an exemplary method of manufacturing the solid-state imaging device according to the fourth embodiment of the present invention (second thereof);

DESCRIPTION OF THE PREFERRED EMBODIMENTS

Hereinafter, embodiments for carrying out the present invention (hereinafter, referred to as embodiments) will be described. The invention will be described in the following sequence:

1. Exemplary Schematic Structure of CMOS Solid-state imaging Device;
2. First Embodiment (examples of solid-state imaging device and method of manufacturing the same);
3. Second Embodiment (examples of solid-state imaging device and method of manufacturing the same);
4. Third Embodiment (examples of solid-state imaging device and method of manufacturing the same);
5. Fourth Embodiment (examples of solid-state imaging device and method of manufacturing the same);
6. Fifth Embodiment (examples of solid-state imaging device and method of manufacturing the same);
7. Sixth Embodiment (examples of solid-state imaging device and method of manufacturing the same);
8. Seventh Embodiment (examples of solid-state imaging device and method of manufacturing the same);
9. Eighth Embodiment (examples of solid-state imaging device and method of manufacturing the same);
10. Ninth Embodiment (examples of solid-state imaging device and method of manufacturing the same); and
11. Tenth Embodiment (example of electronic apparatus)

1. Exemplary Schematic Structure of CMOS Solid-State Imaging Device

Figure 20:
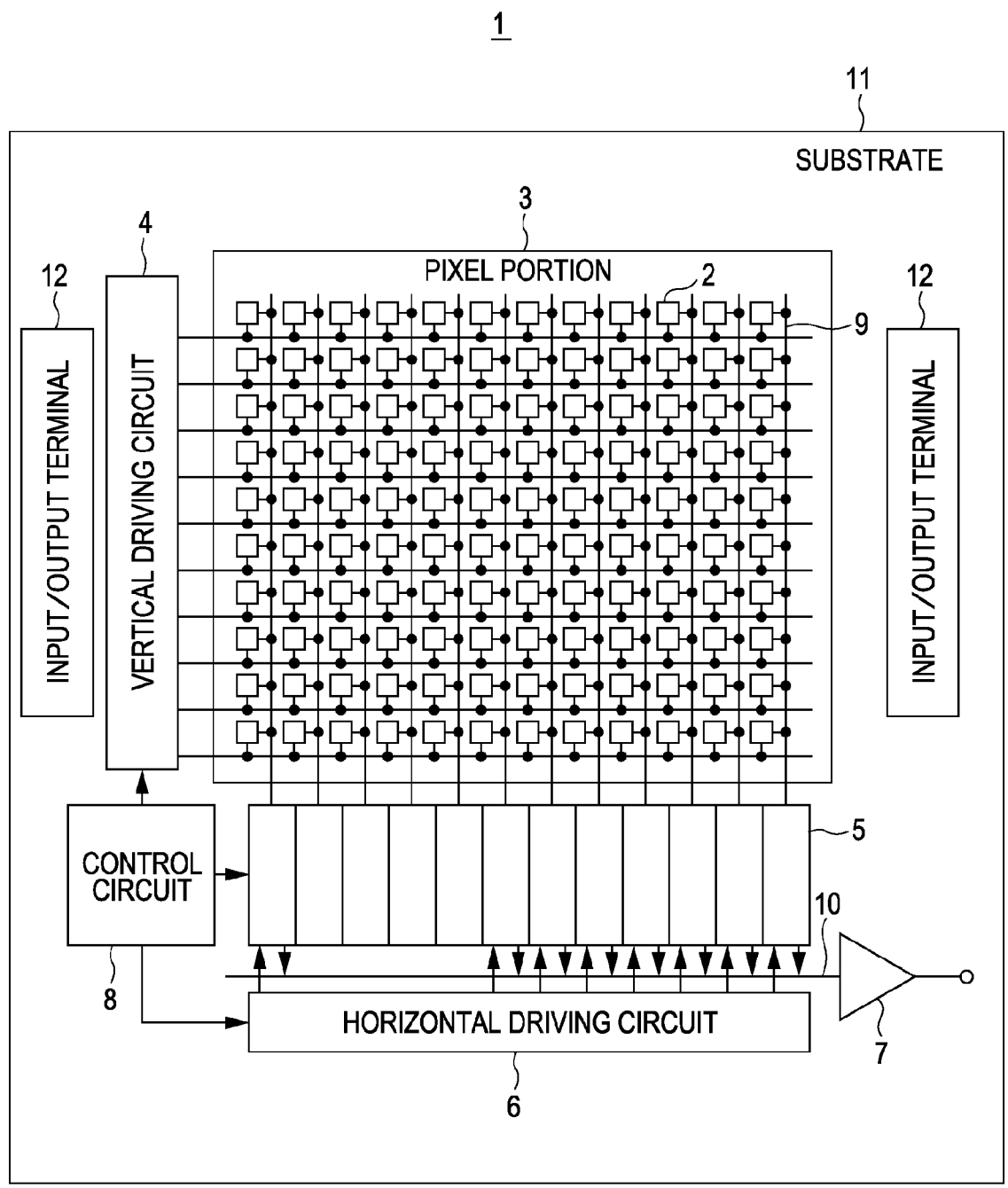
FIG. 20 is a schematic diagram illustrating an exemplary CMOS solid-state imaging device applied to the solid-state imaging device according to an embodiment of the present invention.

FIG. 20 illustrates an exemplary schematic structure of the CMOS solid-state imaging device applied to each embodiment of the present invention. The solid-state imaging device 1 of the present example includes a pixel portion 3 (a so-called imaging area) where a plurality of pixels 2 including a photoelectric conversion portion (photodiode) are regularly arranged in two dimensions on a semiconductor substrate 11, for example, a silicon substrate, and a peripheral circuit sections shown in FIG. 20. As the pixel 2, a unit pixel including a single photoelectric conversion portion and a plurality of pixel transistors may be applied. In addition, as the pixel 2, a so-called pixel sharing structure may be applied, in which a plurality of photoelectric conversion portions are shared with another single pixel transistor group except for the transfer transistor. As described below, a plurality of pixel transistors may have a three-transistor structure having a transfer transistor, a reset transistor, and an amplification transistor or a four-transistor structure with a selection transistor added.

The peripheral circuit portion includes a vertical driving circuit 4, a column signal processing circuit 5, a horizontal driving circuit 6, an output circuit 7, a control circuit 8 and the like.

The control circuit 8 receives an input clock and data for instructing an operation mode or the like and outputs data such as internal information of the solid-state imaging device or the like. That is, the control circuit 8 generates a control signal or a clock signal functioning as a reference of operations of the vertical driving circuit 4, the column signal processing circuit 5, the horizontal driving circuit 6 and the like based on the vertical synchronization signal, the horizontal synchronization signal, and the master clock. Such signals are input to the vertical driving circuit 4, column signal processing circuit 5, the horizontal driving circuit 6, and so on.

The vertical driving circuit 4 may be constructed of, for example, a shift register in which a pixel driving wire line is selected, a pulse for driving the pixel is supplied to the selected pixel driving wire line, and the pixels are driven on a row basis. That is, the vertical driving circuit 4 selectively scans each pixel 2 of the pixel portion 3 in order on a row basis in a vertical direction. A pixel signal corresponding to the signal charge generated, for example, depending on the received light amount of the photodiode which is a photoelectric conversion element of each pixel 2 is supplied to the column signal processing circuit 5 through the vertical signal line 9.

The column signal processing circuit 5 is provided, for example, for each column of the pixel 2, signal processing such as noise rejection for each pixel column is performed for the signals output from the pixels 2 corresponding to a single row. That is, the column signal processing circuit 5 performs signal processing such as CDS, signal amplification, and AD conversion for removing unique fixed pattern noise of the pixel 2. The output stage of the column signal processing circuit 5 is provided with a horizontal selection switch (not shown) connected between the horizontal signal lines 10.

The horizontal driving circuit 6 includes, for example, a shift register. Each column signal processing circuit 5 is sequentially selected by sequentially outputting the horizontal scanning pulse, and the pixel signal is output to the horizontal signal line 10 from each column signal processing circuit 5.

The output circuit 7 performs signal processing for the signal sequentially supplied from each column signal processing circuit 5 through the horizontal signal line 10 and outputs the result of the signal processing. For example, the signal processing may include only buffering, or include black level adjustment, column deviation correction, various kinds of digital signal processing, or the like. The input/output terminal 12 performs exchange of signals with an external unit.

Figure 21:
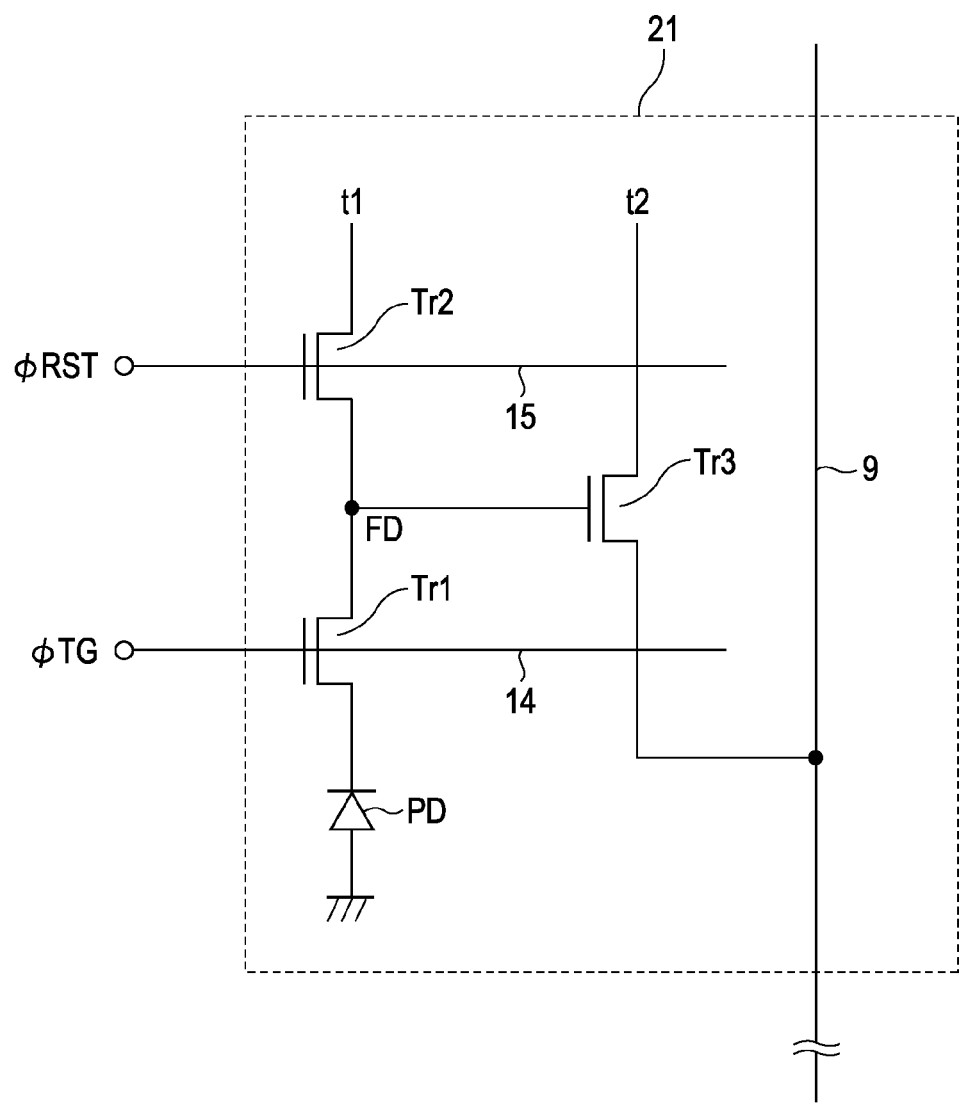
FIG. 21 is an equivalent circuit diagram illustrating an exemplary unit pixel.

FIG. 21 illustrates an exemplary equivalent circuit of the unit pixel. The unit pixel 21 according to the present example includes three pixel transistors and a photodiode PD functioning as the photoelectric conversion portion surrounded by a dashed line. The three pixel transistors include a transfer transistor Tr1, a reset transistor Tr2, and an amplification transistor Tr3. Here, as the pixel transistors Tr1 to Tr3, for example, an n-channel MOS transistor is used.

The photodiode PD is connected to the transfer transistor Tr1. The transfer transistor Tr1 is connected to the reset transistor Tr2 through the floating diffusion portion FD. The signal charges (in this case, electrons) photoelectrically converted in the photodiode PD and accumulated therein are transferred to the floating diffusion portion FD by supplying the transmission pulse φTRG to the gate of the transfer transistor Tr1 through a transmission wire line 14.

The floating diffusion portion FD is connected to the gate of the amplification transistor Tr3. Here, the source of the reset transistor Tr2 (the drain of the transfer transistor Tr1) is used as the floating diffusion portion FD. Before transmission of the signal charge from the photodiode PD to the floating diffusion portion FD, the potential of the floating diffusion portion FD is reset by supplying the reset pulse φRST to the reset gate through the reset wire line 15.

The source of the amplification transistor Tr3 is connected to the vertical signal line 9. The selection/non-selection of the pixel is distinguished by the potential of the floating diffusion portion FD. The amplification transistor Tr3 outputs the potential of the floating diffusion portion FD after it is reset by the reset transistor Tr2 to the vertical signal line 9 as a reset level. Furthermore, the amplification transistor Tr3 outputs the potential of the floating diffusion portion FD after the signal charge is transmitted by the transfer transistor Tr1 to the vertical signal line 9 as the signal level.

Figure 22:
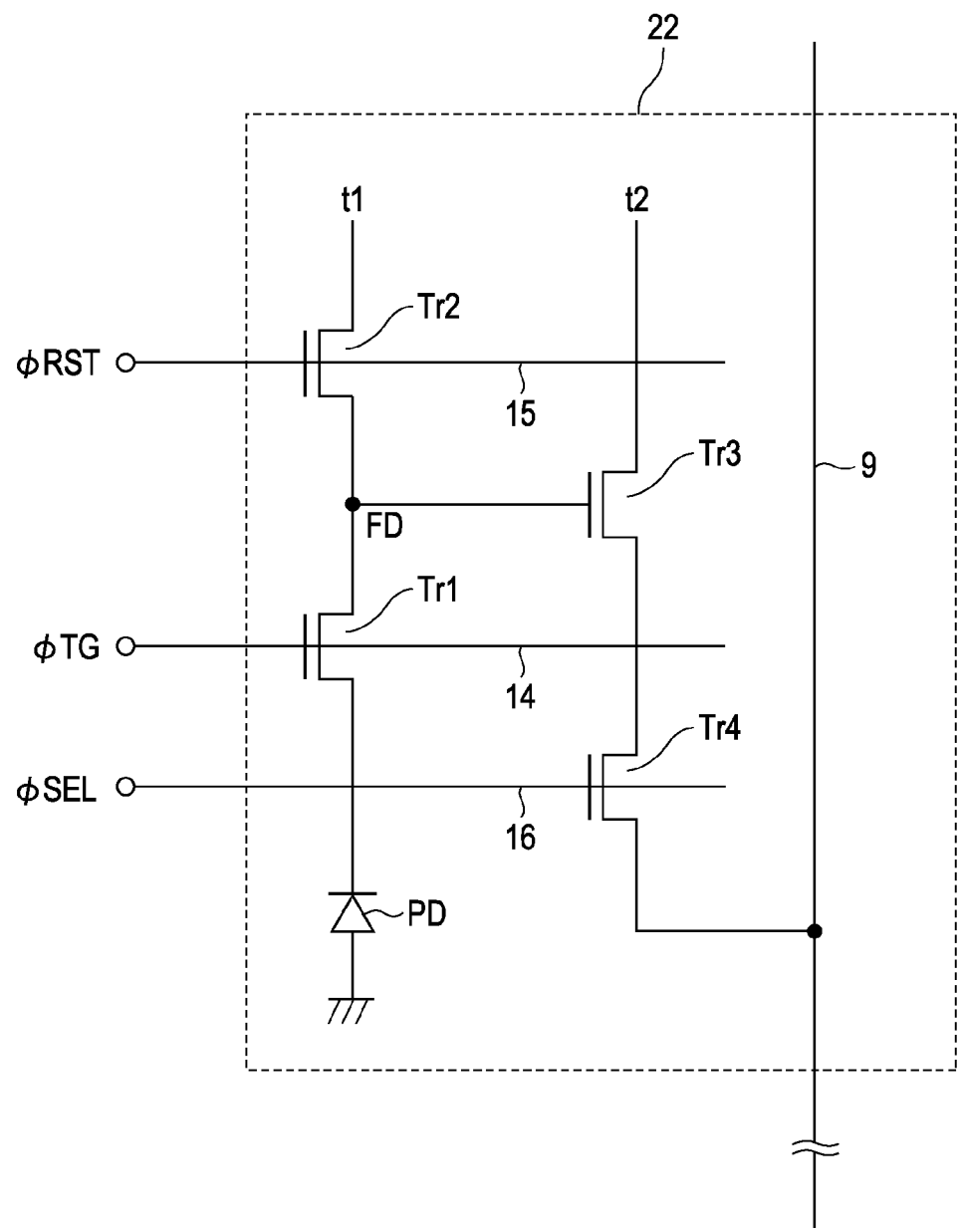
FIG. 22 is an equivalent circuit diagram illustrating another exemplary unit pixel.

FIG. 22 illustrates another exemplary equivalent circuit of the unit pixel. The unit pixel 22 according to the present example includes four pixel transistors and a photodiode PD functioning as the photoelectric conversion portion. The four pixel transistors include a transfer transistor Tr1, a reset transistor Tr2, an amplification transistor Tr3, and a selection transistor Tr4. Here, as the pixel transistors Tr1 to Tr4, for example, an n-channel MOS transistor is used.

The photodiode PD is connected to the transfer transistor Tr1. The transfer transistor Tr1 is connected to the reset transistor Tr2 through the floating diffusion portion FD. The signal charges (in this case, electrons) photoelectrically converted by the photodiode PD and accumulated therein are transmitted to the floating diffusion portion FD by supplying the transmission pulse φTRG to the gate of the transfer transistor Tr1 through the transmission wire line 14.

The floating diffusion portion FD is connected to the gate of the amplification transistor Tr3. Before transfer of the signal charge from the photodiode PD to the floating diffusion portion FD, the potential of the floating diffusion portion FD is reset by supplying the reset pulse φRST to the reset gate through the reset wire line 15.

The source of the amplification transistor Tr3 is connected to the drain of the selection transistor Tr4, and the source of the selection transistor is connected to the vertical signal line 9. The selection transistor Tr4 is turned on by supplying the selection pulse φSEL to the gate of the selection transistor Tr4 through the selection wire line 16 and the pixel is selected. The amplification transistor Tr3 outputs the potential of the floating diffusion portion FD after it is reset by the reset transistor Tr2 through the selection transistor Tr4 to the vertical signal line 9 as a reset level. In addition, the amplification transistor Tr3 outputs, the potential of the floating diffusion portion FD after the signal charge is transmitted by the transfer transistor Tr1 through the selection transistor Tr4 to the vertical signal line 9 as a signal level. Furthermore, the selection transistor 115 may be connected to the drain side of the amplification transistor Tr3. In this case, the source of the amplification transistor Tr3 is connected to the vertical signal line 9.

Figure 23:
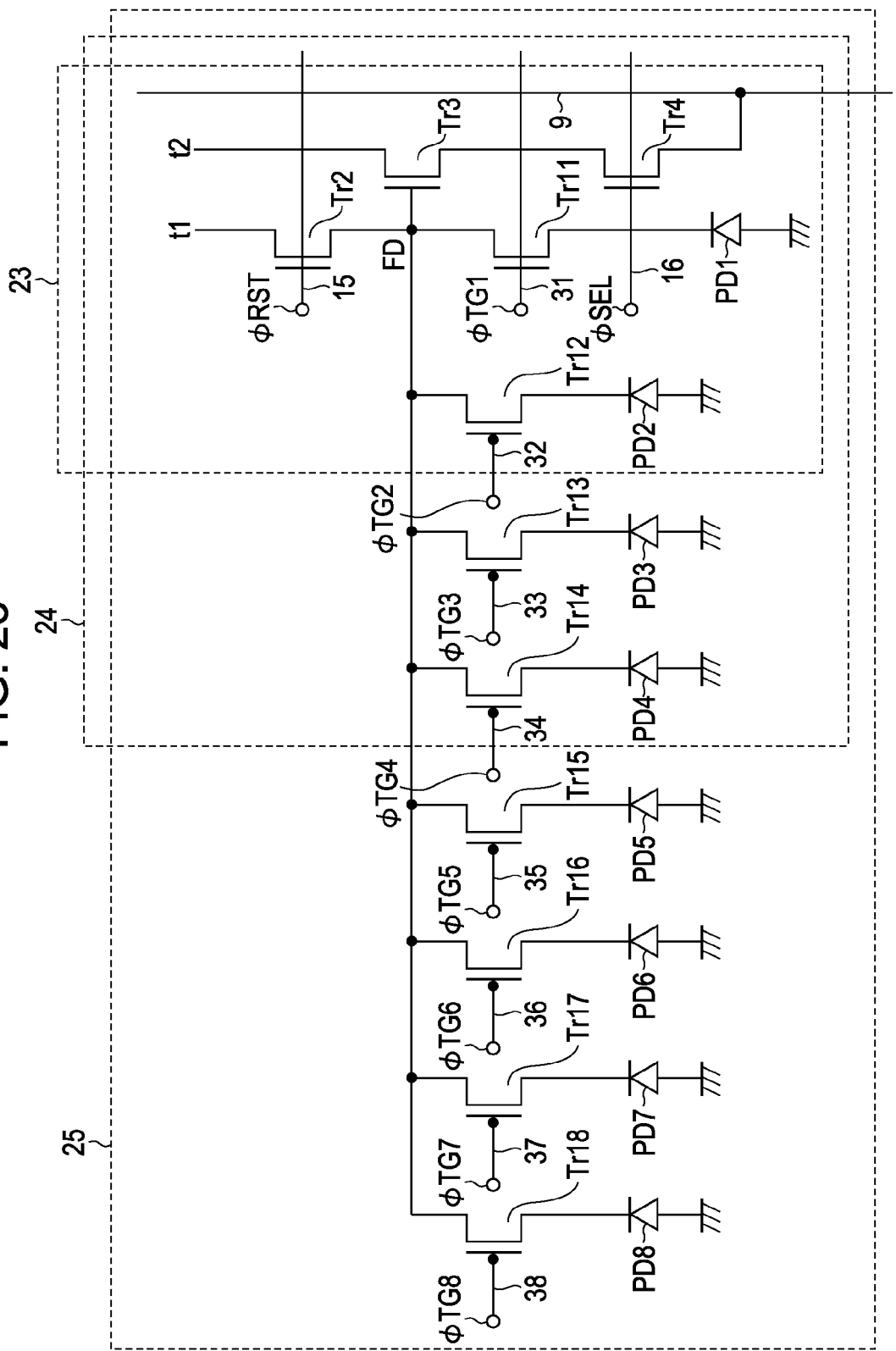
FIG. 23 is an equivalent circuit diagram illustrating exemplary pixel sharing unit.

FIG. 23 illustrates an equivalent circuit for sharing between a plurality of pixels. In FIG. 23, 2-pixel sharing unit 23, 4-pixel sharing unit 24, and 8-pixel sharing unit 25 are illustrated. For example, in the 2-pixel sharing unit 23, the photodiodes PD1 and PD2 which are two photoelectric conversion portions share another single pixel transistor group other than the transfer transistors Tr11 and Tr12. Specifically, the 2-pixel sharing unit 23 includes two photodiodes PD, two transfer transistors Tr11 and Tr12, a single floating diffusion FD, a single reset transistor Tr2, a single amplification transistor Tr3, and a single selection transistor Tr4. Alternatively, the selection transistor may be omitted. The transfer transistors Tr11 and Tr12 which respectively correspond to the photodiodes PD1 and PD2 are connected. Each of the transfer transistors Tr11 and Tr12 is connected to the reset transistor Tr2 through the sharing floating diffusion portion FD, and the floating diffusion portion FD is connected to the gate of the amplification transistor Tr3. The source of the amplification transistor Tr3 is connected to the drain of the selection transistor Tr4. The source of the selection transistor Tr4 is connected to the vertical signal line 9. Transmission pulses φTG1 and φTG2 are applied to the gates of the transfer transistors Tr11 and Tr12 through the transmission wire lines 31 and 32, respectively. A reset pulse φRST is applied to the gate of the reset transistor Tr2 through the reset wire line 15. A selection pulse φSEL is applied to the gate of the selection transistor Tr4 through the selection wire line 16.

The 4-pixel sharing unit 24 further includes two photodiodes PD3 and PD4, two transfer transistors Tr13 and Tr14 in addition to the circuit components of the 2-pixel sharing unit 23. Specifically, four transfer transistors Tr11 to Tr14 which respectively correspond to a total of four photodiodes PD [PD1 to PD4] are connected, and the sources of the transfer transistors Tr1 to Tr14 are commonly connected to the floating diffusion portion FD.

The 8-pixel sharing unit 25 further includes four photodiodes PD5 to PD8 and four transfer transistors Tr15 to Tr18 in addition to the circuit components of the 4-pixel sharing unit 24. Specifically, eight transfer transistors Tr11 to Tr18 which respectively correspond to a total of eight photodiodes PD [PD1 to PD8] are connected, and the sources of the transfer transistors Tr11 to Tr18 are commonly connected to the floating diffusion portion FD.

In any one of FIGS. 21, 22, and 23, the drain terminals t1 and t2 of the reset transistor and the amplification transistor are supplied with a necessary voltage. Typically, a power source VDD is connected to the drain terminals t1 and t2. A two-series power source may be used.

2. First Embodiment

Exemplary Structure of Solid-State Imaging Device

Figure 1:
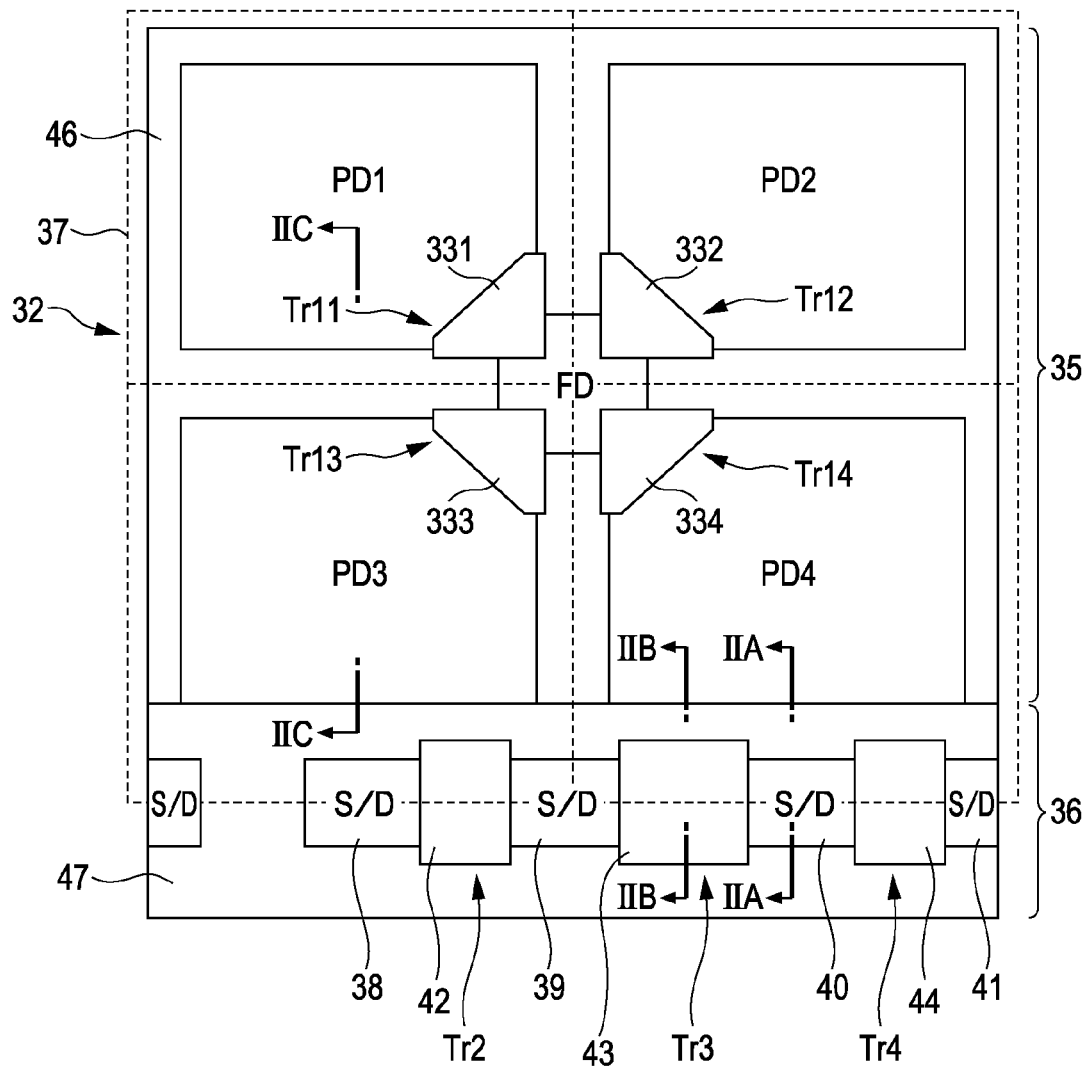
FIG. 1 is a schematic diagram illustrating main components of the solid-state imaging device according to a first embodiment of the present invention.
Figure 2A:
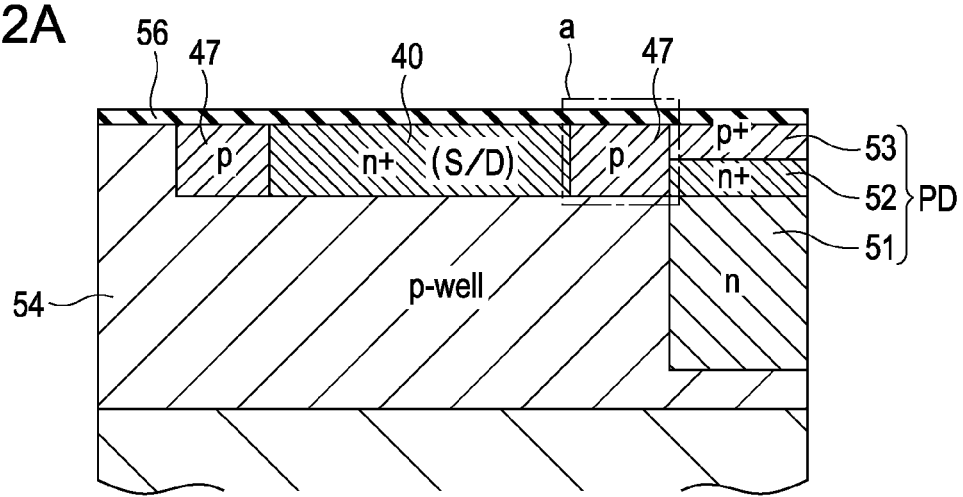
FIGS. 2A to 2C are schematic cross-sectional views taken along the lines IIA-IIA, IIB-IIB, and IIC-IIC, respectively, of FIG. 1.
Figure 2B:
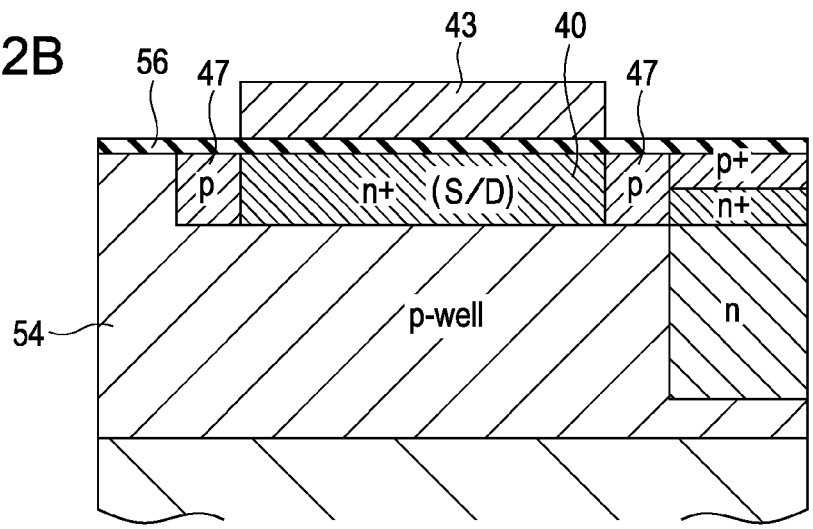
Figure 2C:
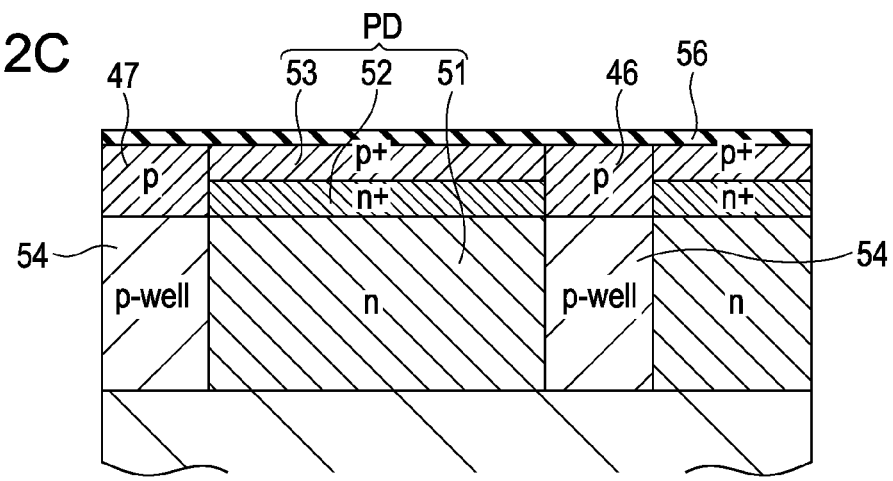

FIGS. 1 and 2C illustrate a solid-state imaging device according to first embodiment of the present invention. In the present embodiment, a CMOS solid-state imaging device may be applied in which a so-called 4-pixel sharing unit, where 2 horizontal pixels×2 vertical pixels constitute a unit, is arranged in two dimensions. As shown in FIG. 1, in the solid-state imaging device 31 according to the first embodiment of the invention, a pixel portion is constructed by arranging the 4-pixel sharing unit 32 in two dimensions, and the 4-pixel sharing unit 32 is obtained by arranging four photodiodes PD [PD1 to PD4] which are the photoelectric conversion portions of four pixels. The 4-pixel sharing unit 32 share four photodiodes PD and a single pixel transistor group other than the transfer transistors. Specifically, in the 4-pixel sharing unit 32, a single floating diffusion region FD is shared by four photodiodes PD1 to PD4. The pixel transistor includes four transfer transistors Tr1 [Tr11 to Tr14], and a single reset transistor Tr2, a single amplification transistor Tr3, and a single selection transistor Tr4 that are shared. In the present example, while the pixel transistor has a 4-transistor structure, a 3-transistor structure may be used.

The floating diffusion region FD is arranged in the center surrounded by four photodiodes PD1 to PD4. The transfer transistors Tr11 to Tr14 are each formed to have the transmission gate electrodes 33 [331 to 334] arranged between the shared floating diffusion region FD and the corresponding photodiodes PD1 to PD4.

Here, the area, which includes the photodiodes PD1 to PD4, the floating diffusion region FD, and the transfer transistors Tr11 to Tr14 of each row of the 4-pixel sharing unit, is a photodiode formation area 35. In addition, the area, which includes the reset transistor Tr2, the amplification transistor Tr3, and the selection transistor Tr4 sharing 4 pixels out of the pixel transistors of each row of the 4-pixel sharing unit, is a pixel transistor formation area 36. The photodiode formation area 35 and the pixel transistor formation area 36 which are continuous in the horizontal direction are alternately arranged in the vertical direction of the pixel portion.

The area 37 corresponding to one pixel includes each photodiode PD and surrounded by the horizontal and vertical lines passing through the center of the floating diffusion region FD, the horizontal line passing through the center of the pixel transistor formation area 36, the vertical line passing through the center between the horizontally neighboring 4-pixel sharing unit.

The reset transistor Tr2 includes a pair of source and drain regions 38 and 39 and a reset gate electrode 42. The amplification transistor Tr3 includes a pair of source and drain regions 39 and 40 and an amplification gate electrode 43. The selection transistor Tr4 includes a pair of source and drain regions 40 and 41 and a selection gate electrode 44.

The floating diffusion region FD and each of source and drain regions 38 to 41 are formed from a first conductivity type semiconductor region. In the present example, since electrons are used as the signal charges, the floating diffusion region FD and each source and drain region 38 to 41 are formed in an n-type semiconductor region.

In the present embodiment, both the first isolation region 46 formed within the photodiode formation area 35 and the second isolation region 47 surrounding the pixel transistors Tr2 to Tr4 within the pixel transistor formation area 36 are formed from a second conductivity type, for example, a p-type impurity semiconductor layer. That is, the first isolation region 46 between the neighboring photodiodes PD is formed from a p-type semiconductor layer, and the second isolation region 47 between the pixel transistors Tr2 to Tr4 and the photodiode PD is formed from a p-type semiconductor layer.

The impurity concentrations of the first and second isolation regions 46 and 47 are set to different values, each of which is optimal. That is, the impurity concentration of the first isolation region 46 is set to a lower concentration as long as the element isolation between the photodiodes PD can be guaranteed. On the other hand, the impurity concentration of the second isolation region 47 is set to a higher value than that of the first isolation region 46, i.e., a value capable of obtaining isolation between source and drain regions 38 to 41 having a high impurity concentration of the pixel transistors Tr2 to Tr4.

A description will be provided with reference to FIGS. 2A to 2C (cross-sectional views). FIGS. 2A to 2C illustrate cross sections taken along the lines IIA-IIA, IIB-IIB, and IIC-IIC of FIG. 1, respectively. Each photodiode PD includes an n-type semiconductor region 51, a charge accumulation region 52 made of a high concentration n+ semiconductor region, and a p-type semiconductor region 53 for suppressing a dark current on the surface thereof. A p-type semiconductor well region 54 is formed in the area where the photodiodes PD and the pixel transistors Tr11 to Tr14 and Tr2 to Tr4 are formed through ion implantation. The first isolation region 46 made of a p-type semiconductor layer having an optimal impurity concentration is formed in the area to the depth of the charge accumulation region 52 from the surface of the substrate between the neighboring photodiodes PD of the photodiode formation area 35 through ion implantation. The second isolation region 47 having an optimal concentration higher than the impurity concentration of the first isolation region 46 is formed through ion implantation in the n-type source and drain regions, i.e., between the source and drain region 40 and the photodiode PD in the drawing as indicated by a rectangular box a. The gate electrode, i.e., the amplification gate electrode 43 in the drawing, is formed in the gate insulation film 56.

Figure 3A:
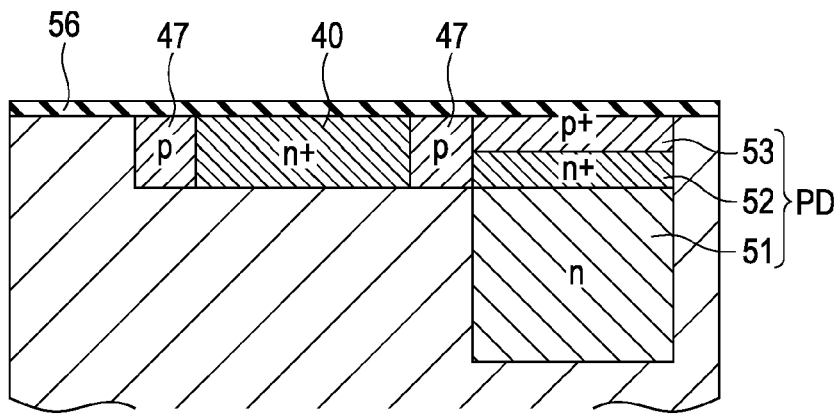
FIGS. 3A to 3C are schematic cross-sectional views according to the first embodiment of the present invention.
Figure 3B:
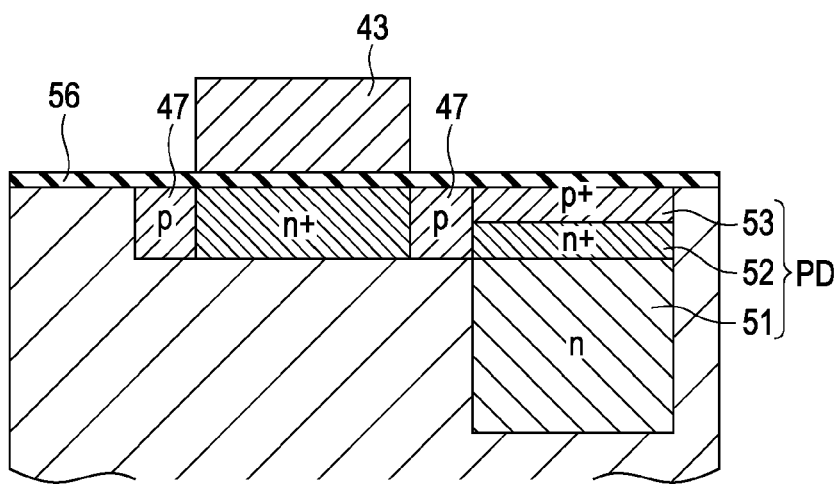
Figure 3C:
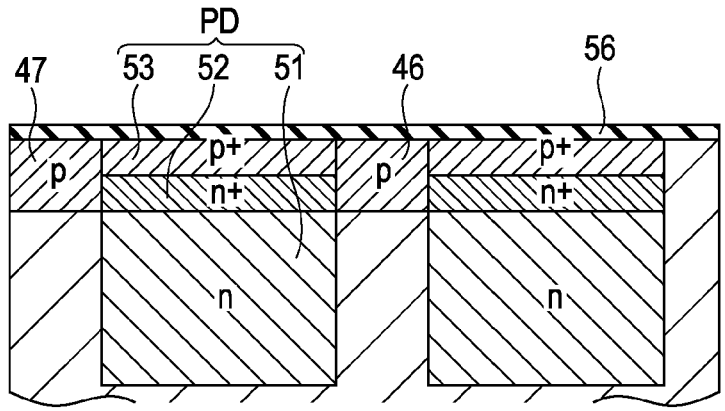

FIGS. 3A to 3C schematically illustrate the first and second isolation regions 46 and 47 according to an embodiment of the present invention for easy understanding. The schematic structures of FIGS. 3A to 3C illustrate a cross section between the source and drain region of the pixel transistor and the photodiode, a cross section between the gate electrode of the pixel transistor and the photodiode, and a cross section between the photodiodes, respectively.

The solid-state imaging device 31 according to the first embodiment of the present invention may be formed as a back-side illumination type CMOS solid-state imaging device or a front-side illumination type CMOS solid-state imaging device. In the back-side illumination type CMOS solid-state imaging device, a wire line layer having a plurality of layers of wire lines is formed in an interlayer insulation film on the surface side of the semiconductor substrate, and a support member is bonded onto the wire line layer. In addition, the semiconductor substrate having the photodiodes PD is made into a thin film by polishing and etching from the back face, and a color filter and an on-chip lens are formed on the back face of the substrate. As a result, a back-side illumination type CMOS solid-state imaging device is constructed as a light input face by using the back face of the substrate opposite to the side where the wire line layer is formed.

In the surface irradiation type CMOS solid-state imaging device, the wire line layer having a plurality of layers of wires is formed in the interlayer insulation film in the surface side of the semiconductor substrate, and a color filter and an on-chip lens are formed in a planarization film thereon.

In the solid-state imaging device 31 according to the first embodiment of the present invention, it is possible to improve pixel characteristics such as a saturation characteristic, sensitivity, mixed color, and white spots at the floating diffusion FD, and conversion efficiency. That is, the impurity concentration of the first isolation region 46 between the photodiodes PD within the photodiode formation area 35 is set to an optimal concentration sufficient to obtain isolation between the photodiodes PD so as to provide a low concentration. As a result, it is possible to suppress the impurities of the first isolation region 46 from diffusing into the photodiode PD. Therefore, even when the number of the pixels increases, or the pixel becomes finer, it is possible to obtain a larger area for the photodiode PD in comparison with the related art and improve a saturation characteristic, i.e., a saturation charge amount Qs. In addition, it is possible to improve sensitivity.

Since the impurity concentration of the first isolation region 46 is reduced, an electric field intensity in the p-n junction of the floating diffusion region FD is reduced, and generation of white spots in the floating diffusion region FD is suppressed. In addition, since the junction capacity of the floating diffusion region FD is reduced in comparison with the related art, it is possible to improve conversion efficiency.

Since the concentration of the first isolation region 46 is reduced, it is possible to reduce the impurity concentration of the n-type semiconductor region included in the floating diffusion region FD. Furthermore, it is possible to suppress generation of white spots in the floating diffusion region FD and improve conversion efficiency.

Since the concentration of the first isolation region 46 of the photodiode formation area 35 is reduced, and diffusion to the photodiode PD side is suppressed, it is possible to form a substantially narrow line width. Therefore, the mixed color generated by the signal charges photoelectrically converted by the light incidence to the first isolation region 46 is alleviated.

Furthermore, since it is possible to increase conversion efficiency and reduce noise such as mixed color, it is possible to improve the S/N ratio.

On the other hand, in the pixel transistor formation area 36, the impurity concentration of the second isolation region 47 is set to an optimal value sufficient to obtain isolation between the n-type source and drain regions 38 to 41 so as to provide a high concentration. As a result, it is possible to suppress generation of current leakage between the n-type source and drain regions 38 to 41 having a high concentration and guarantee element isolation.

For example, since it is possible to increase the width of the gate of the amplification transistor Tr3, it is possible to improve a random noise characteristic.

Exemplary Method of Manufacturing Solid-State Imaging Device

A method of manufacturing the solid-state imaging device 31 according to the first embodiment of the present invention includes a process of forming photodiodes PD and pixels having pixel transistors Tr1 to Tr4, i.e., the 4-pixel sharing unit, a process of forming the first isolation region 46, and a process of forming the second isolation region 47. The 4-pixel sharing unit is formed by four photodiodes PD sharing a single pixel transistor group other than the transfer transistors. In the first embodiment of the present invention, as shown in FIG. 1, low concentration p-type impurities are implanted to the isolation regions within the photodiode formation area 35 and the pixel transistor formation area 36 by a first ion implantation process. That is, low concentration p-type impurities are implanted by a first ion implantation process to obtain isolation between the photodiodes PD. Then, p-type impurities are implanted to the isolation region within the pixel transistor formation area 36 by a second ion implantation process. A dose amount of impurities of the second ion implantation is set to a dose amount where a total concentration of the first and second ion implantation processes is a high concentration such that current leakage is not generated between source and drain regions and isolation between source and drain regions is guaranteed.

Next, an exemplary method of manufacturing the solid-state imaging device 31 according to the first embodiment of the present invention will be described with reference to the manufacturing flowchart of FIG. 4 and the manufacturing process diagram of FIGS. 5A to 6C.

Figure 4:
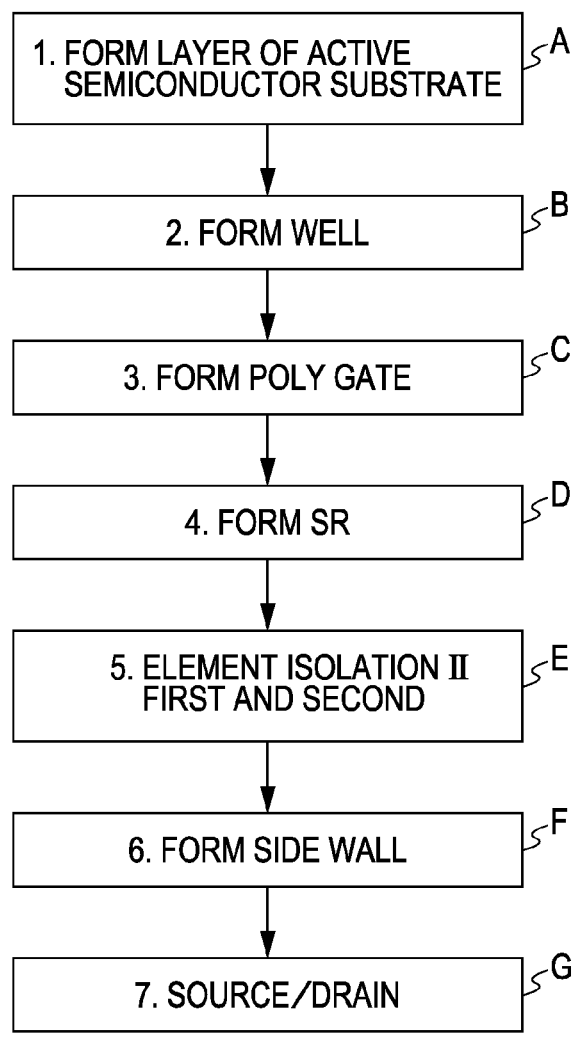
FIG. 4 is a flowchart illustrating a manufacturing flow of the solid-state imaging device according to the first embodiment of the present invention.
Figure 5A:
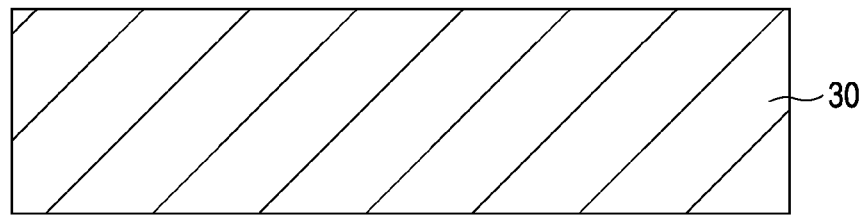
FIGS. 5A to 5D are process cross-sectional views illustrating an exemplary method of manufacturing the solid-state imaging device according to the first embodiment of the present invention (first thereof)

First, as shown in the process A of FIG. 4 and FIG. 5A, a desired conductivity type, e.g., an n-type or p-type silicon semiconductor substrate 30 is prepared.

Figure 5B:
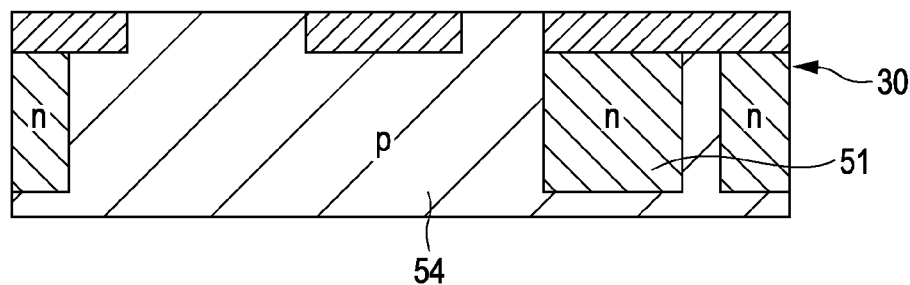

Then, as shown in the process B of FIG. 4 and FIG. 5B, a second conductivity type (in the present example, a p-type) semiconductor well region 54 is formed on the semiconductor substrate 30 through ion implantation. Then, a first conductivity type (in the present example, an n-type) semiconductor region 51 is formed in the area corresponding to the photodiodes PD of the 4-pixel sharing unit through ion implantation.

Figure 5C:
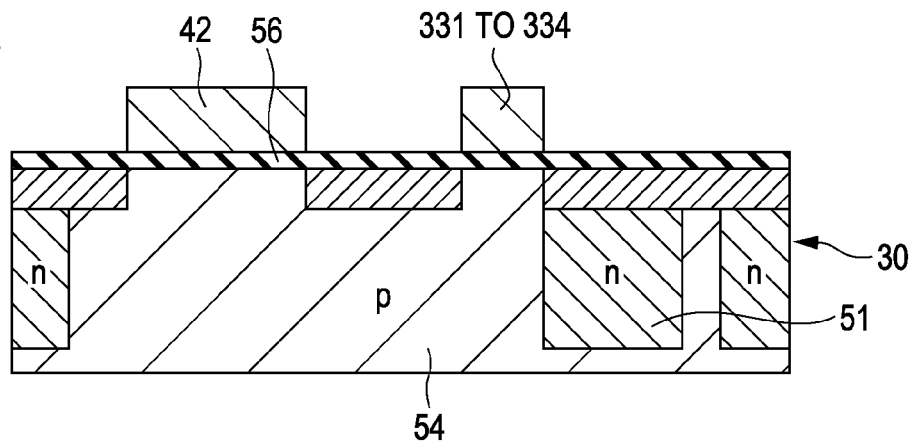

Then, as shown in the process C of FIG. 4 and FIG. 5C, the gate electrodes of the pixel transistors Tr11 to Tr14 and Tr2 to Tr4 are formed on the surface of the semiconductor substrate 30 in a gate insulation film 56. In the drawings, the transmission gate electrodes 331 to 334 of the transfer transistors Tr11 to Tr14 and the reset gate electrode 42 of the reset transistor Tr2 are illustrated. The gate electrode is formed of a polysilicon film.

Figure 5D:
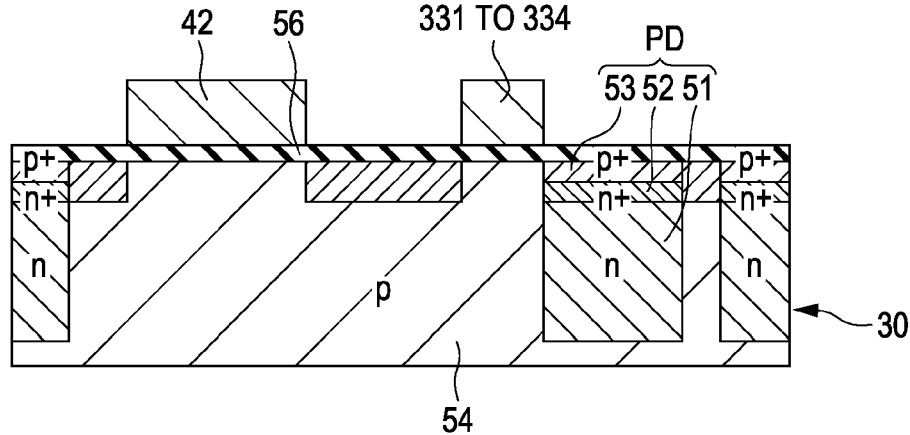

Then, as shown in the process D of FIG. 4 and FIG. 5D, a charge accumulation region 52, which is an n-type semiconductor region having a higher concentration than that of the n-type semiconductor region 51, and a high concentration p-type semiconductor region 53, which also suppresses a dark current on the surface, are formed on the n-type semiconductor region 51 corresponding to the photodiode PD. The n-type charge accumulation region 52 and the p-type semiconductor region 53 are formed through ion implantation. The photodiodes PD [PD1 to PD4] are formed by the n-type semiconductor region 51, the n-type charge accumulation region 52, and the p-type semiconductor region 53.

Figure 6A:
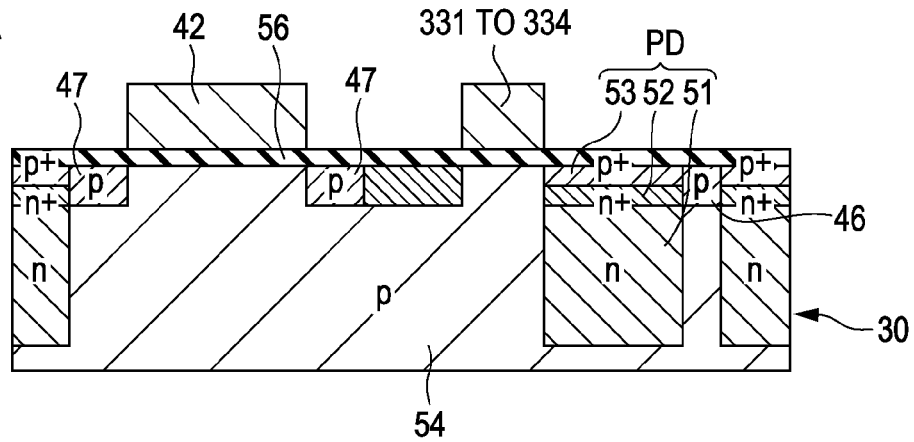
FIGS. 6A to 6C are process cross-sectional views illustrating an exemplary method of manufacturing the solid-state imaging device according to the first embodiment of the present invention (second thereof)

Then, as shown in the process E of FIG. 4 and FIG. 6A the first isolation region 46 of the photodiode formation area 35 and the second isolation region 47 of the pixel transistor formation area 36 are formed through first and second p-type impurity ion implantation processes.

That is, through the first ion implantation process, the p-type impurity ions are collectively implanted to the area corresponding to the isolation region within the photodiode formation area 35 and the area corresponding to the isolation region within the pixel transistor formation area 36. A dose amount at this time is an optimal dose amount capable of guaranteeing isolation between the photodiodes PD and smaller than the dose amount of the isolation region around the pixel transistor. The dose amount of the impurity ions of the first ion implantation process may be set to, for example, about $1 \times 10^{12}$ to $1 \times 10^{13}$ cm$^{-2}$.

Then, through the second ion implantation process, p-type impurity ions are selectively implanted to only the area corresponding to the isolation region within the pixel transistor formation area 36. A total dose amount of the impurity ions within the pixel transistor formation area 36 is an optimal dose amount capable of guaranteeing isolation between the source and drain regions. The dose amount of the impurity ions of the second ion implantation process may be set to, for example, about $1 \times 10^{12}$ to $1 \times 10^{13}$ cm$^{-2}$. Through the first ion implantation process, the first isolation region 46 is formed between the photodiodes PD within the photodiode formation area 35. Through the first and second ion implantation processes, the second isolation region 47 is formed between the pixel transistors Tr2 to Tr4 and photodiodes PD and around the pixel transistor within the pixel transistor formation area 36.

Figure 6B:
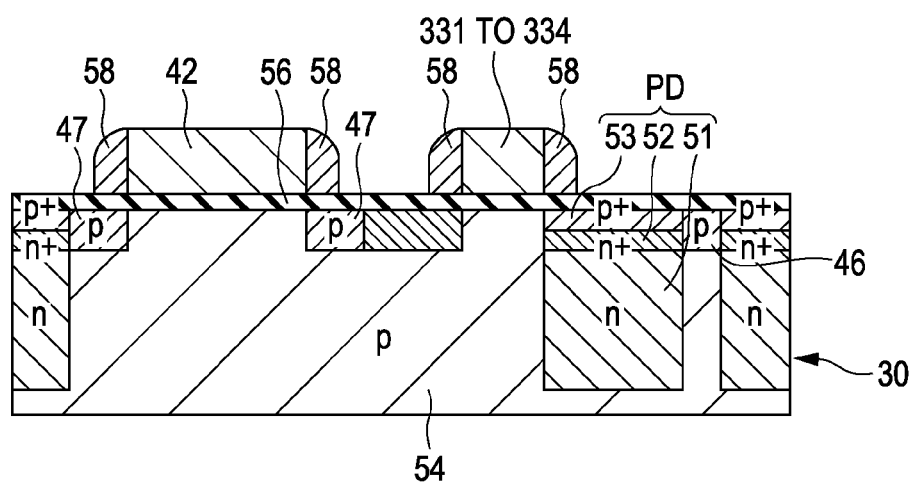

Then, as shown in the process F of FIG. 4 and FIG. 6B, a side wall 58 made of an insulation film is formed in the end of the gate electrode of the pixel transistors Tr11 to Tr14 and Tr2 to Tr4.

Figure 6C:
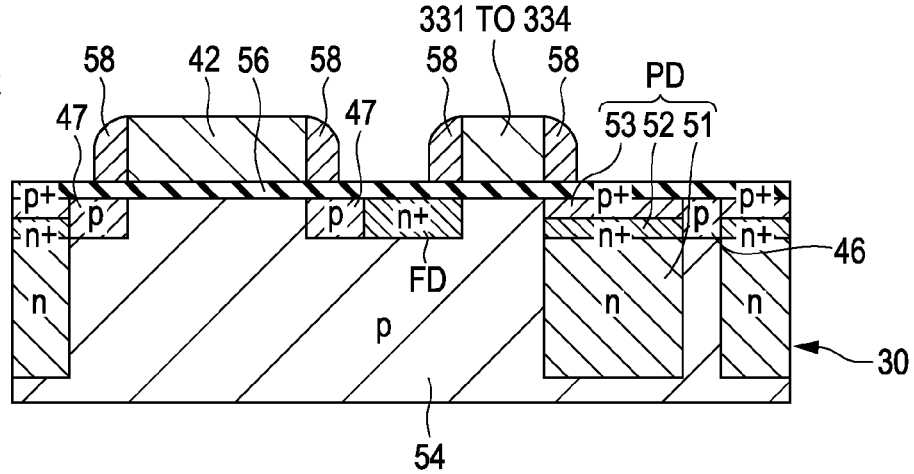

Then, as shown in the process G of FIG. 4 and FIG. 6C, the n-type floating diffusion region FD and the n-type source and drain regions 38 to 41 of the pixel transistors Tr2 to Tr4 are formed by implanting n-type impurity ions. A dose amount of the n-type impurity ions at this time may be set to about $1\times10^{14}$ to $5\times10^{15}$ cm$^{-2}$. Therefore, the impurity concentration of the source and drain regions becomes about $5\times10^{20}$ to $2\times10^{21}$ cm$^{-2}$.

Then, although not shown in the drawings, in the case where a back-side illumination type CMOS solid-state imaging device is formed, a wire line layer where a plurality of layers of wires are arranged is formed over the surface of the semiconductor substrate 30 in the interlayer insulation film. For example, a separate silicon substrate, which is a support substrate, is bonded to the wire line layer, and then, the semiconductor substrate is made into a thin film by polishing and etching the back face of the semiconductor substrate 30 up to a desired depth. Then, a p-type semiconductor region for suppressing a dark current is formed on the back face of the substrate, and furthermore, a color filter and an on-chip lens are formed in an insulation film on the back face of the substrate, so that a desired back-side illumination type CMOS solid-state imaging device is obtained.

In the case where the front-side illumination type CMOS solid-state imaging device is formed, a wire line layer obtained by arranging a plurality of layers of wire lines in the interlayer insulation film is formed over the surface of the semiconductor substrate 30. The wires are formed over the area excluding the photodiode PD. Then, a color filter and an on-chip lens are formed in a planarization film on the wire line layer so that a desired front-side illumination type CMOS solid-state imaging device is obtained.

In the method of manufacturing the solid-state imaging device 31 according to the first embodiment of the present invention, the first and second isolation regions 46 and 47 are formed by performing ion implantation two times. Specifically, a first ion implantation process is collectively performed for the photodiode formation area 35 and the pixel transistor formation area 36, and a second ion implantation process is performed only for the pixel transistor formation area 36. By performing the ion implantation two times, it is possible to form the first isolation region 46 having a low impurity concentration and the second isolation region 47 having a high impurity concentration with high precision. Therefore, it is possible to manufacture a CMOS solid-state imaging device with high precision by which a saturation characteristic, conversion efficiency, and a random noise characteristic are improved, generation of white spots in the floating diffusion FD is suppressed, and mixed color is alleviated.

3. Second Embodiment

Exemplary Structure of Solid-State Imaging Device

FIG. 7 illustrates the solid-state imaging device according to the second embodiment of the present invention. In the present embodiment, as described above, a CMOS solid-state imaging device may be applied in which a so-called 4-pixel sharing unit, where 2 horizontal pixels×2 vertical pixels constitute a unit, is arranged in two dimensions. As shown in FIG. 7, in the solid-state imaging device 61 according to the second embodiment of the invention, a pixel portion is constructed by arranging the 4-pixel sharing unit 32 in two dimensions, and the 4-pixel sharing unit 32 is obtained by arranging four photodiodes PD [PD1 to PD4] which are the photoelectric conversion portions of four pixels. As described above, the 4-pixel sharing unit 32 includes the photodiode formation area 35 and the pixel transistor formation area 36, and the first and second isolation regions 46 and 47 are formed from the p-type impurity semiconductor layer.

In the present embodiment, the photodiode formation area 35 and the pixel transistor formation area 36 are separated and an optimal dose amount of p-type impurity ions is implanted so that the first and second isolation regions 46 and 47 are formed to have an optimal concentration. That is, the first isolation region 46 having an optimal high concentration is formed between the photodiodes PD of the photodiode formation area 35. The second isolation region 47 having an optimal low concentration is formed around the pixel transistors of the pixel transistor formation area 36.

Other structures are similar to those of the first embodiment. In FIG. 7, like reference numerals denote like elements as in FIG. 1, and a description thereof will be omitted.

In the solid-state imaging device 61 according to the second embodiment of the present invention, the impurity concentration of the first isolation region 35 between the photodiodes PD within the photodiode formation area 46 becomes an optimal low concentration, and the impurity concentration of the second isolation region 47 within the pixel transistor formation area 36 becomes an optimal high concentration. Therefore, although a description is not repeated, in the same manner as the first embodiment, it is possible to improve a saturation characteristic, i.e., a saturation charge amount QS and sensitivity. It is possible to suppress generation of white spots in the floating diffusion region FD. It is possible to improve conversion efficiency. Furthermore, it is possible to alleviate mixed color. It is possible to improve a random noise characteristic.

Further, since the second isolation region 47 is optimally formed in the pixel transistor formation area 36 to have a high concentration, it is possible to suppress generation of current leakage between the source and drain regions 38 to 41 so as to guarantee element isolation. Since it is possible to widen the width of the gate of the amplification transistor, it is possible to improve a random noise characteristic.

Exemplary Method of Manufacturing Solid-State Imaging Device

A method of manufacturing the solid-state imaging device 61 according to the second embodiment of the present invention includes a process of forming a pixel including a photodiode PD and pixel transistors Tr1 to Tr4, i.e., a 4-pixel sharing unit, a process of forming the first isolation region 46, and a process of forming the second isolation region 47. The present embodiment is similar to the first embodiment described above except that ion implantation processes for the first isolation region and the second isolation region are separately performed. In regard to the manufacturing process shown in FIGS. 4 and 5A to 6C, according to the second embodiment of the present invention, in the process E of FIG. 4 and FIG. 6A, for example, ions are implanted only to the photodiode formation area 35 through the first ion implantation process to form the first isolation region 46 having an optimal concentration. Then, ions are implanted only to the pixel transistor formation area 36 through the second ion implantation process to form the second isolation region 47 having an optimal concentration. Alternatively, the second isolation region 47 may be formed through the first ion implantation process, and the first isolation region 46 may be formed through the second ion implantation process. Other processes are similar to those shown in FIGS. 4 and 5A to 6C.

In the method of manufacturing the solid-state imaging device 61 according to the second embodiment of the present invention, as described above, it is possible to manufacture the CMOS solid-state imaging device with high precision, by which a saturation characteristic, conversion efficiency, and a random noise characteristic are improved, generation of white spots in the floating diffusion FD is suppressed, and mixed color is alleviated.

4. Third Embodiment

Exemplary Structure of Solid-State Imaging Device

FIG. 8 illustrates a solid-state imaging device according to a third embodiment of the present invention. In the present embodiment, as described above, a CMOS solid-state imaging device may be applied in which a so-called 4-pixel sharing unit, where 2 horizontal pixels×2 vertical pixels constitute a unit, is arranged in two dimensions. As shown in FIG. 8, in the solid-state imaging device 63 according to the third embodiment of the invention, a pixel portion is constructed by arranging the 4-pixel sharing unit 32 in two dimensions, and the 4-pixel sharing unit 32 is obtained by arranging four photodiodes PD [PD1 to PD4] which are the photoelectric conversion portions of four pixels. As described above, the 4-pixel sharing unit 32 includes the photodiode formation area 35 and the pixel transistor formation area 36, and the first and second isolation regions 46 and 47 are formed from the p-type impurity semiconductor layer.

In the present embodiment, the second isolation region 47 is formed between the source and drain regions 38 to 41 of the pixel transistors Tr2 to Tr4 and the photodiodes PD. In addition, the first isolation region 46 is formed to extend from the gap between the neighboring photodiodes PD to the gap between the photodiodes and gate electrodes 42 to 44 of the pixel transistors Tr2 to Tr4. That is, the first isolation region 46 having an optimal low concentration is formed between the neighboring photodiodes PD and around the pixel transistors Tr2 to Tr4 by collectively performing the first ion implantation process for the photodiode formation area 35 and the pixel transistor area 36. Then, the second ion implantation process is performed to surround only the source and drain regions 38 to 41 of the pixel transistors Tr2 to Tr4 so as to form the second isolation region 47 having an optimal high concentration.

Other structures are similar to those of the first embodiment. In FIG. 8, like reference numerals denote like elements as in FIG. 1, and a description thereof will be omitted.

In the solid-state imaging device 61 according to the third embodiment of the present invention, the first isolation region 46 having an optimal low concentration is formed to extend from the gap between the photodiodes PD within the photodiode formation area 35 to the gap between the photodiode PD and the gate electrode of the pixel transistor formation area 36. In addition, the second isolation region 47 having an optimal high concentration is formed only around the source and drain regions 38 to 41 within the pixel transistor formation area 36. Therefore, although a description is not repeated, in the same manner as the first embodiment, it is possible to improve a saturation characteristic, i.e., a saturation charge amount QS and sensitivity. It is possible to suppress generation of white spots in the floating diffusion region FD. It is possible to improve conversion efficiency. Furthermore, it is possible to alleviate mixed color. It is possible to improve a random noise characteristic.

Further, since the second isolation region 47 having an optimal high concentration is formed only around the source and drain regions 38 to 41 in the pixel transistor formation area 36, it is possible to suppress generation of current leakage between the source and drain regions 38 to 41 so as to guarantee element isolation. Since the contact portion of the second isolation region 47 adjoining the photodiode PD is smaller in comparison with the first and second embodiments, influence of the impurities of the second isolation region 47 on the photodiode PD is negligible. Since it is possible to widen the width of the gate of the amplification transistor, it is possible to improve a random noise characteristic.

Exemplary Method of Manufacturing Solid-State Imaging Device

A method of manufacturing the solid-state imaging device 61 according to the third embodiment of the present invention includes a process of forming a pixel including a photodiode PD and pixel transistors Tr1 to Tr4, i.e., a 4-pixel sharing unit, a process of forming the first isolation region 46, and a process of forming the second isolation region 47. In the present embodiment, the first ion implantation process is collectively performed for the photodiode formation area 35 and the pixel transistor formation area 36. Then, the second ion implantation process is performed for the gap between the source and drain regions 38 and 41 and the photodiode PD in the pixel transistor formation area 36 excluding the gap between the gate electrodes 42 to 44 of the pixel transistors Tr2 to Tr4 and the photodiodes PD. In regard to the manufacturing process shown in FIGS. 4 and 5A to 6C, in the process E of FIG. 4 and FIG. 6A, for example, ions are collectively implanted to the photodiode formation area 35 and the pixel transistor formation area 36 through the first ion implantation process to form the first isolation region 46 having an optimal concentration. Then, ions are implanted only to the source and drain regions 38 to 41 and the gap between the photodiodes PD in the pixel transistor formation area 36 through the second ion implantation process to form the second isolation region 47 having an optimal concentration. Other processes are similar to those shown in FIGS. 4 and 5A to 6C.

In the method of manufacturing the solid-state imaging device 61 according to the third embodiment of the present invention, as described above, it is possible to manufacture the CMOS solid-state imaging device with high precision, by which a saturation characteristic, conversion efficiency, and a random noise characteristic are improved, generation of white spots in the floating diffusion FD is suppressed, and mixed color is alleviated.

5. Fourth Embodiment

Exemplary Structure of Solid-State Imaging Device

Figure 9:
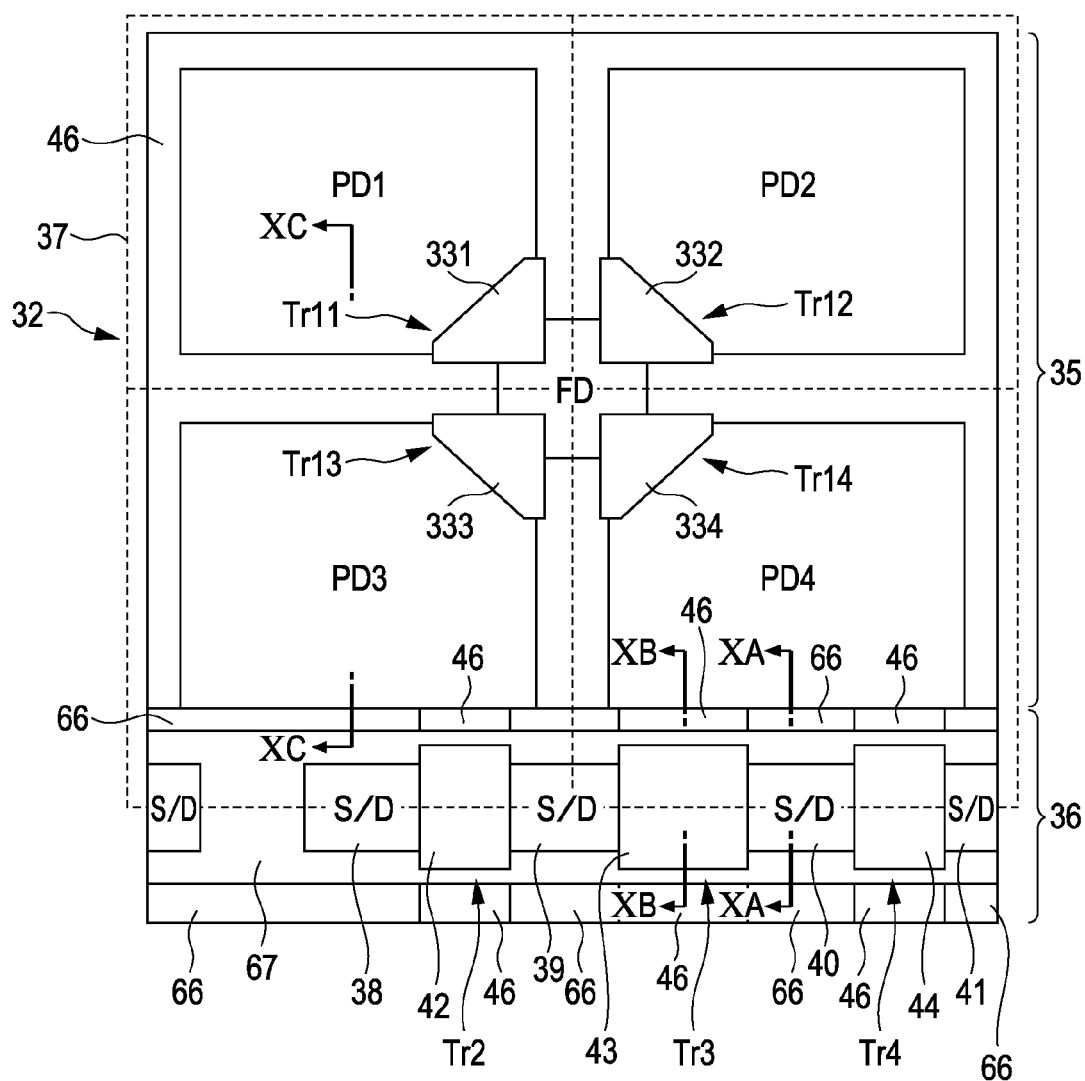
FIG. 9 is a schematic diagram illustrating main components of the solid-state imaging device according to a fourth embodiment of the present invention.
Figure 10A:
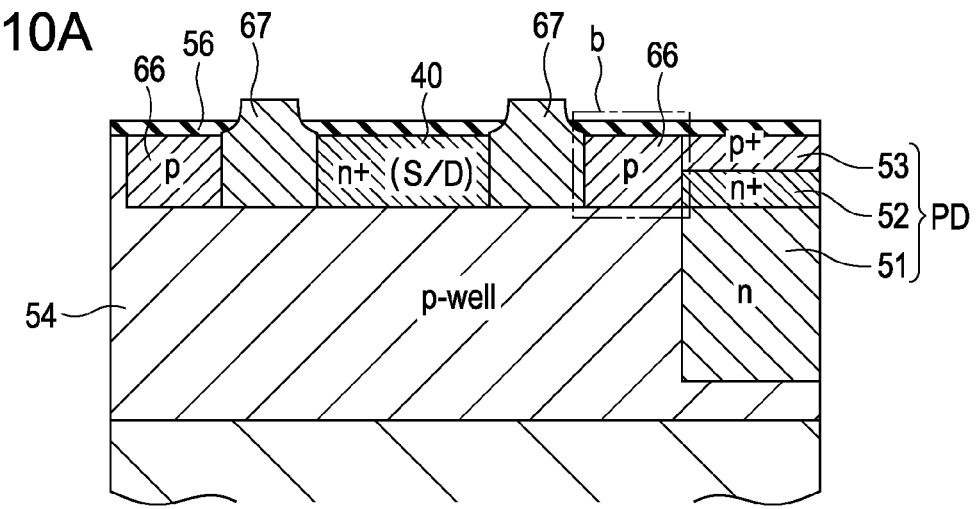
FIGS. 10A to 10C are schematic cross-sectional views taken along the lines XA-XA, XB-XB, and XC-XC of FIG. 9.
Figure 10B:
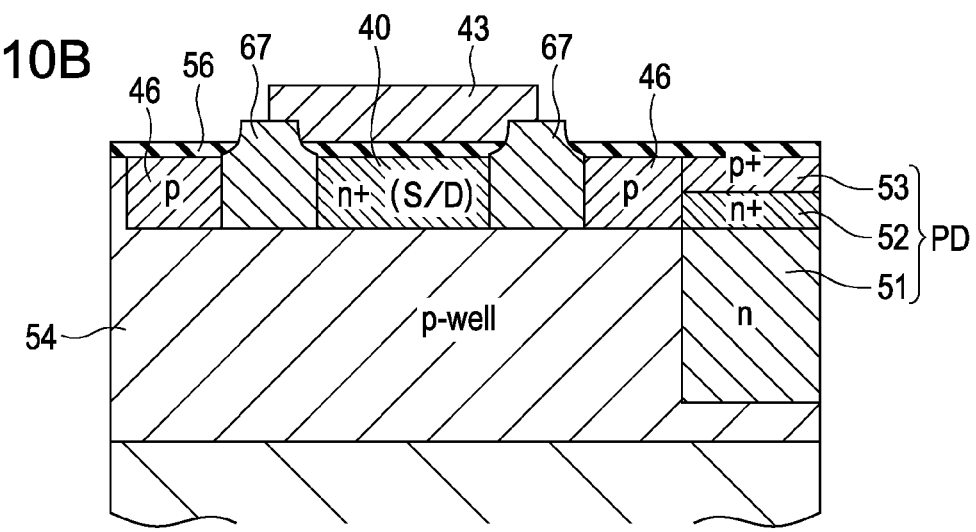
Figure 10C:
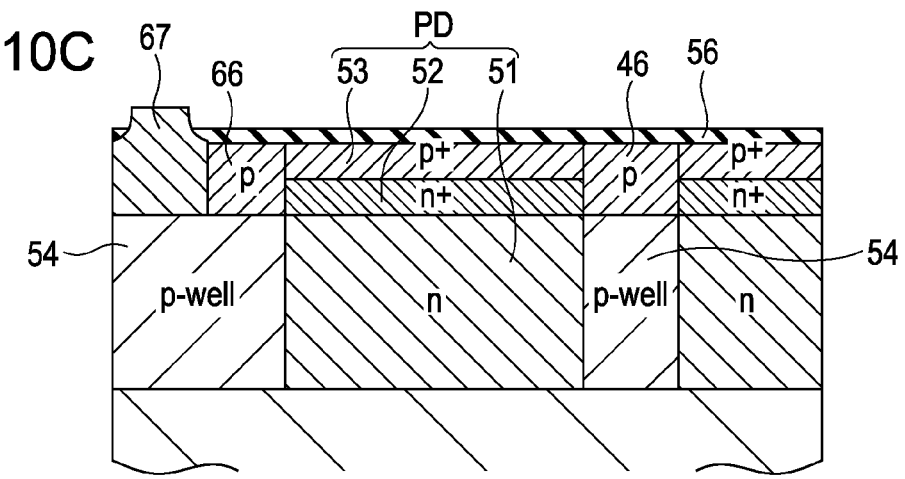

FIGS. 9 and 10C illustrate the solid-state imaging device according to the fourth embodiment of the present invention. In the present embodiment, a CMOS solid-state imaging device may be applied in which a so-called 4-pixel sharing unit, where 2 horizontal pixels×2 vertical pixels constitute a unit, is arranged in two dimensions. As shown in FIG. 1, in the solid-state imaging device 65 according to the fourth embodiment of the invention, a pixel portion is constructed by arranging the 4-pixel sharing unit 32 in two dimensions, and the 4-pixel sharing unit 32 is obtained by arranging four photodiodes PD [PD1 to PD4] which are the photoelectric conversion portions of four pixels. As described above, the 4-pixel sharing unit 32 includes the photodiode formation area 35 and the pixel transistor formation area 36.

In the present embodiment, the first isolation region 46 formed within the photodiode formation area 35 is formed from a second conductivity type, e.g., a p-type impurity semiconductor layer. That is, the first isolation region 46 between the neighboring photodiodes PD is formed from the p-type semiconductor layer. On the other hand, the isolation region formed within the pixel transistor formation area 36 is formed by the second and third isolation regions 66 and 67. That is, the third isolation region 67 is formed using an STI structure surrounding the pixel transistors Tr2 to Tr4. Furthermore, the second isolation region 66 is formed using the p-type semiconductor layer between the third isolation region 67 and the photodiodes PD between the pixel transistor Tr2 to Tr4 and the photodiodes PD.

The impurity concentrations of the first and second isolation regions 46 and 66 are set to different values, each of which is optimal. That is, the first isolation region 46 is set to a lower concentration as long as the element isolation between the photodiodes PD can be guaranteed. The second isolation region 66 is set to an impurity concentration that is lower than that of the first isolation region 46 because the third isolation region 67 with an STI structure exists.

A description will be provided with reference to FIGS. 10A to 10C (cross-sectional views). FIGS. 10A to 10C illustrate cross sections taken along the lines XA-XA, XB-XB, and XC-XC of FIG. 9, respectively. Each photodiode PD includes an n-type semiconductor region 51, a charge accumulation region 52 made of a high concentration n+ semiconductor region, and a p-type semiconductor region 53 for suppressing a dark current on the surface thereof. A p-type semiconductor well region 54 is formed in the area where the photodiodes PD and the pixel transistors Tr11 to Tr14 and Tr2 to Tr4 are formed through ion implantation. The first isolation region 46 made of a p-type semiconductor layer having an optimal impurity concentration is formed in the area to the depth of the charge accumulation region 52 from the surface of the substrate between the neighboring photodiodes PD of the photodiode formation area 35 through ion implantation. The third isolation region 67 using an STI structure is formed around the pixel transistors Tr2 to Tr4. The second isolation region 66 having a concentration that is lower than that of the first isolation region 46 is formed between the third isolation region 67 and the photodiode PD as indicated by a rectangular box b. In the drawing, the amplification gate electrode 43 is formed in the gate insulation film 56.

Figure 11A:
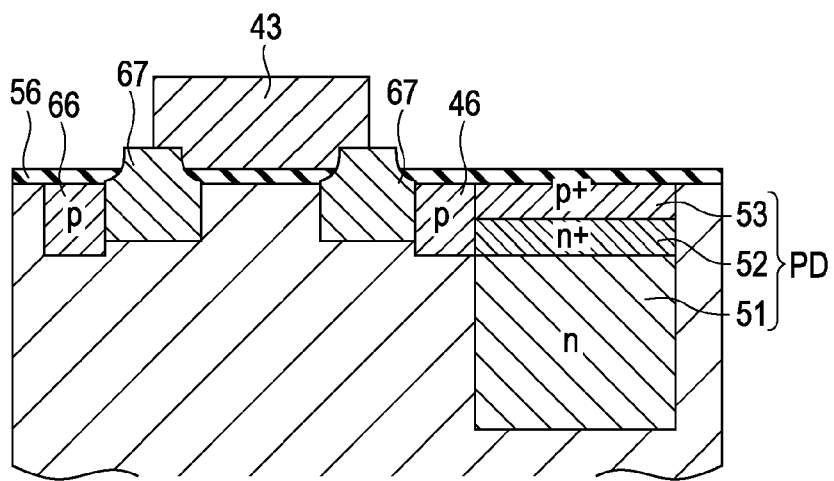
FIGS. 11A to 11C are schematic cross-sectional views illustrating the solid-state imaging device according to the fourth embodiment of the present invention.
Figure 11B:
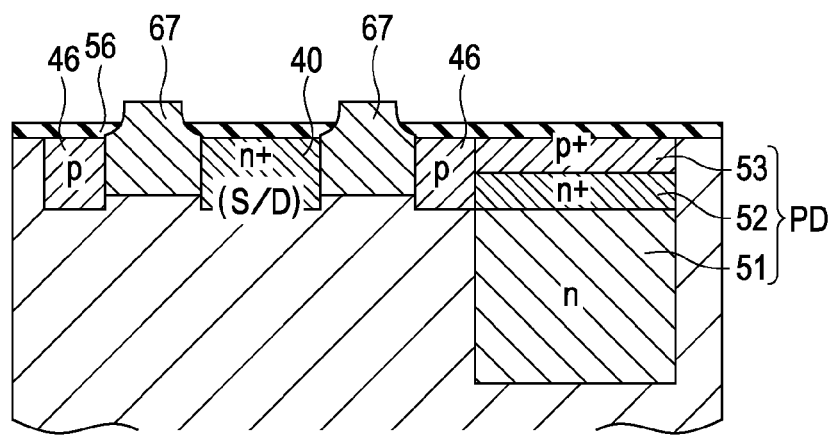
Figure 11C:
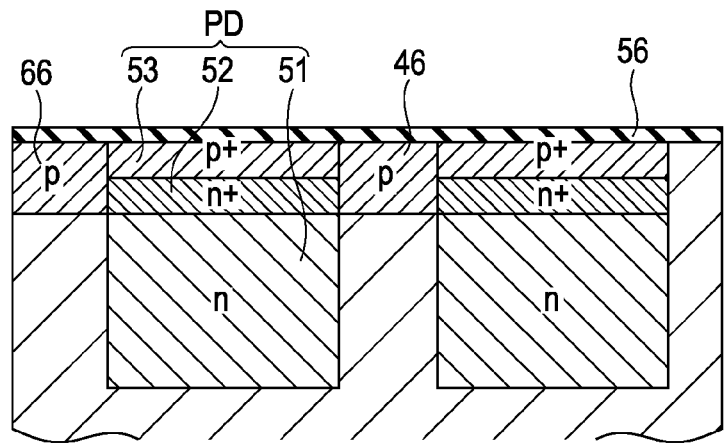

FIGS. 11A to 11C schematically illustrate the first, second, and third isolation regions 46, 66, and 67 according to an embodiment of the present invention for easy understanding. The schematic structures of FIGS. 11A to 11C illustrate a cross section between the source and drain region of the pixel transistor and the photodiode, a cross section between the gate electrode of the pixel transistor and the photodiode, and a cross section between the photodiodes, respectively.

Other structures are similar to those of the first embodiment as described above. In FIG. 9, like reference numerals denote like elements as in FIG. 1, and a description thereof will be omitted.

The solid-state imaging device 65 according to the fourth embodiment of the present invention may be formed as a back-side illumination type CMOS solid-state imaging device or a front-side illumination type CMOS solid-state imaging device as described above.

In the solid-state imaging device 65 according to the fourth embodiment of the present invention, the impurity concentration of the first isolation region 46 between the photodiodes PD within the photodiode formation area 35 is set to an optimal concentration sufficient to guarantee isolation between the photodiodes PD so as to provide a lower concentration. As a result, it is possible to suppress the impurities of the first isolation region 46 from diffusing into the photodiode PD. Therefore, it is possible to obtain a larger area for the photodiode PD in comparison with the related art and improve a saturation characteristic, i.e., a saturation charge amount Qs. In addition, it is possible to improve sensitivity.

Since the impurity concentration of the first isolation region 46 is reduced, an electric field intensity in the p-n junction of the floating diffusion region FD is reduced, and generation of white spots in the floating diffusion region FD is suppressed. In addition, since the junction capacity of the floating diffusion region FD is reduced in comparison with the related art, it is possible to improve conversion efficiency.

Since the concentration of the first isolation region 46 is reduced, it is possible to also reduce the impurity concentration of the n-type semiconductor region included in the floating diffusion region FD. Furthermore, it is possible to suppress generation of white spots in the floating diffusion region and improve conversion efficiency.

Since the concentration of the first isolation region 46 of the photodiode formation area 35 is reduced, and diffusion to the photodiode PD side is suppressed, it is possible to form a substantially narrow line width. Therefore, the mixed color generated by the signal charges photoelectrically converted by the light incidence to the first isolation region 46 is alleviated. Furthermore, since the element isolation implantation between the pixel transistor and the photodiode can be made in a low concentration, it is possible to increase the area under the gate electrode of the amplification transistor Tr3 to make it difficult for diffusion to occur. Therefore, it is possible to improve a random noise characteristic.

Further, in the pixel transistor formation area 36, since the third isolation region 67 is formed using an STI structure surrounding the pixel transistors Tr2 to Tr4, it is possible to suppress generation of current leakage between the n-type source and drain regions 38 to 41 having a high concentration and guarantee element isolation. By means of the third isolation region 67 using an STI structure, it is possible to obtain an impurity concentration of the second isolation region 66 that is lower than that of the first isolation region 46. Since the second isolation region 66 has a low concentration, it is possible to widen the photodiode PD toward the second isolation region 66 side and further improve a saturation charge amount Qs and sensitivity.

In addition, a single pixel 37 in the 4-pixel sharing has a square shape. When the photodiode PD is widened toward the second isolation region 66 side, the photodiode PD becomes closer to a square shape, so that the center of the photodiode PD is closer to the optical center. That is, the optical center of the on-chip lens is located in the pixel center, and the center of the photodiode PD is closer to the optical center, so that mixed color is alleviated.

Exemplary Method of Manufacturing Solid-State Imaging Device

A method of manufacturing the solid-state imaging device 65 according to the fourth embodiment of the present invention includes a process of forming photodiodes PD and pixels having pixel transistors Tr1 to Tr4, i.e., the 4-pixel sharing unit. In addition, the method includes a process of forming the third isolation region 67 with an STI structure for isolating between the photodiode PD and the pixel transistors Tr2 to Tr4. Furthermore, the method includes a process of forming the first isolation region 46 by implanting impurity ions between the neighboring photodiodes PD and forming the second isolation region 66 having an impurity concentration that is lower than that of the first isolation region 46 between the third isolation region 67 and the photodiode PD.

Next, an exemplary method of manufacturing the solid-state imaging device 65 according to the fourth embodiment of the present invention will be described with reference to the manufacturing flowchart of FIG. 12 and the manufacturing process diagram of FIGS. 13A to 14C.

Figure 12:
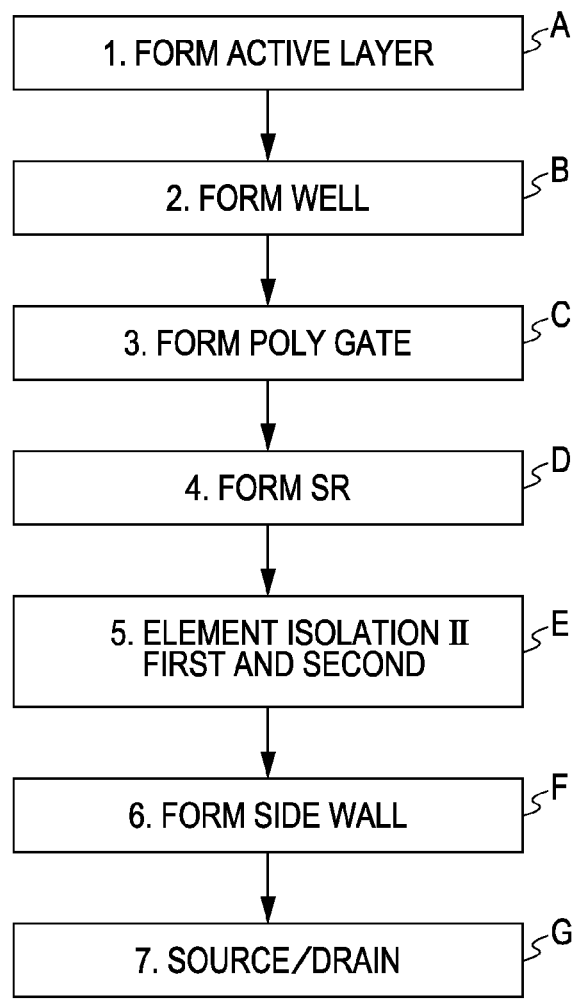
FIG. 12 is a flowchart illustrating a manufacturing flow of the solid-state imaging device according to the fourth embodiment of the present invention.
Figure 13A:
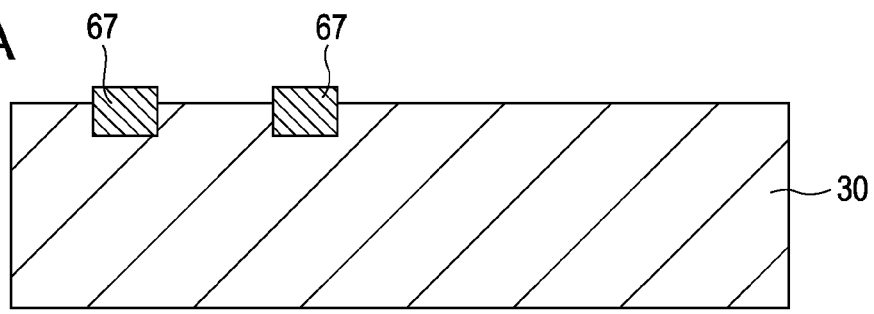
FIGS. 13A to 13D are process cross-sectional views illustrating an exemplary method of manufacturing the solid-state imaging device according to the fourth embodiment of the present invention (first thereof)

First, as shown in the process A of FIG. 12 and FIG. 13A, a desired conductivity type, e.g., an n-type or p-type silicon semiconductor substrate 30 is prepared. In addition, the third isolation region 67 using an STI structure is formed through a typical process on the surface of the area corresponding to the pixel portion of the semiconductor substrate 30.

Figure 13B:
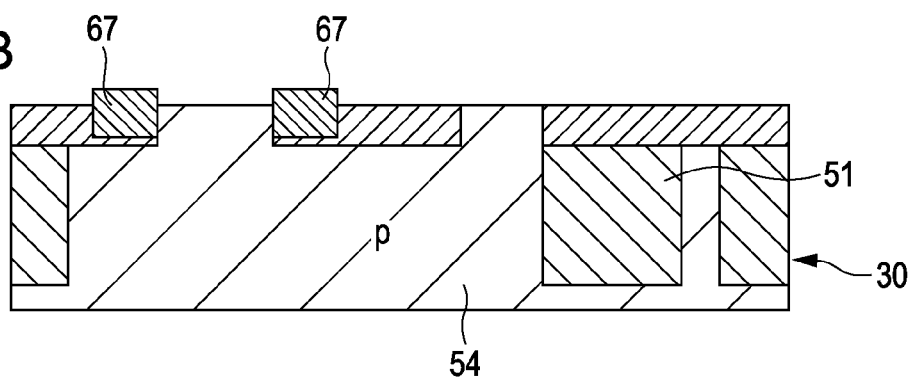

Then, as shown in the process B of FIG. 12 and FIG. 13B, a second conductivity type (in the present example, a p-type) semiconductor well region 54 is formed on the semiconductor substrate 30 through ion implantation. Then, a first conductivity type (in the present example, an n-type) semiconductor region 51 is formed in the area corresponding to the photodiodes PD of the 4-pixel sharing unit through ion implantation.

Figure 13C:
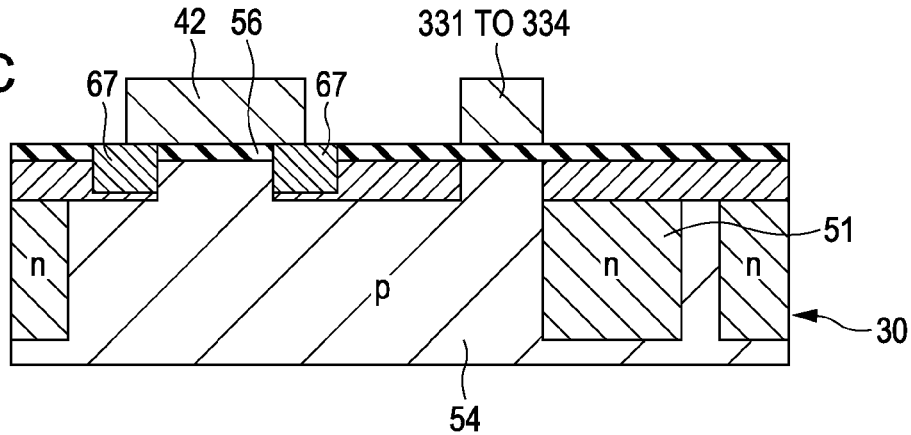

Then, as shown in the process C of FIG. 12 and FIG. 13C, the gate electrodes of the pixel transistors Tr11 to Tr14 and Tr2 to Tr4 are formed on the surface of the semiconductor substrate 30 in a gate insulation film 56. In the drawings, the transmission gate electrodes 331 to 334 of the transfer transistors Tr11 to Tr14 and the reset gate electrode 42 of the reset transistor Tr2 are illustrated. The gate electrode is formed of a poly-silicon film.

Figure 13D:
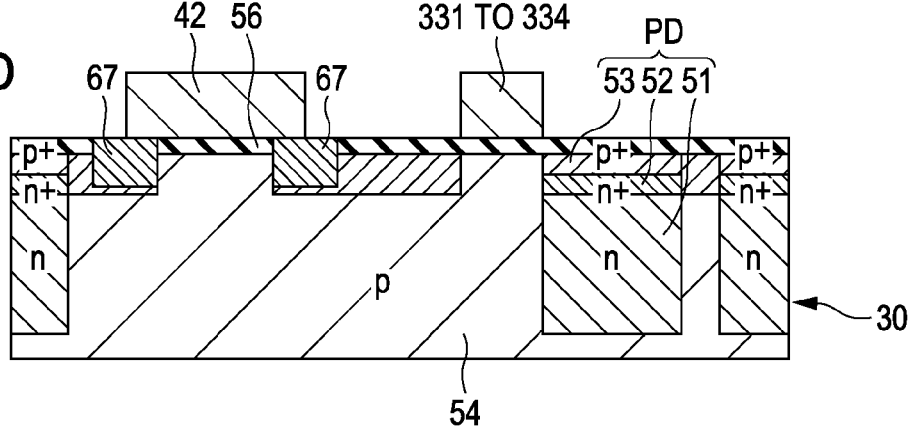

Then, as shown in the process D of FIG. 12 and FIG. 13D, a charge accumulation region 52 made from an n-type semiconductor region having a higher concentration than that of the n-type semiconductor region 51, and a high concentration p-type semiconductor region 53, which also suppresses a dark current on the surface thereof, are formed on the n-type semiconductor region 51 corresponding to the photodiode PD. The n-type charge accumulation region 52 and the p-type semiconductor region 53 are formed through ion implantation. The photodiodes PD [PD1 to PD4] are formed by the n-type semiconductor region 51, the n-type charge accumulation region 52, and the p-type semiconductor region 53.

Figure 14A:
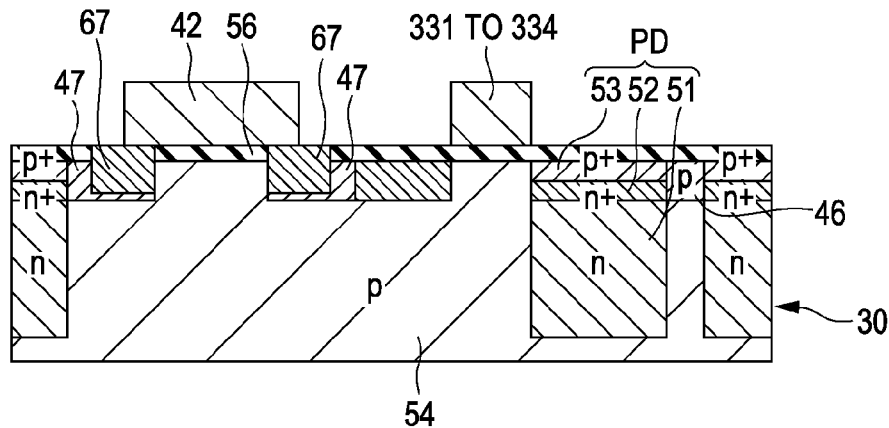

Then, as shown in the process E of FIG. 12 and FIG. 14A, the first isolation region 46 of the photodiode formation area 35 and the second isolation region 66 of the pixel transistor formation area 36 are formed through first and second p-type impurity ion implantation processes.

That is, through the first ion implantation process, the p-type impurity ions are collectively implanted to the area corresponding to the isolation region within the photodiode formation area 35 and the area corresponding to the isolation region within the pixel transistor formation area 36. A dose amount at this time is a low dose amount capable of guaranteeing the impurity concentration of the second isolation region 66 and is smaller than the dose amount of the first isolation region 46 between the photodiodes PD formed thereafter.

Then, through the second ion implantation process, p-type impurity ions are selectively implanted to only the area corresponding to the isolation region within the photodiode formation area 35. A total dose amount of the impurity ions within the photodiode formation area 35 is an optimal dose amount capable of guaranteeing isolation between the photodiodes PD. Through the first ion implantation process, the isolation region 66 is formed. Through the first and second ion implantation processes, the first isolation region 46 is formed between the photodiodes PD within the photodiode formation area 35.

Figure 14B:
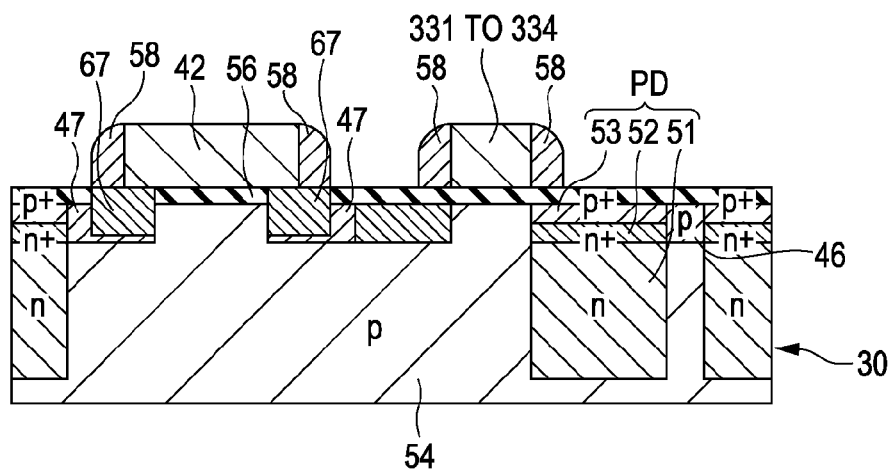

Then, as shown in the process F of FIG. 12 and FIG. 14B, a side wall 58 made of an insulation film is formed in the end of the gate electrode of the pixel transistors Tr11 to Tr14 and Tr2 to Tr4.

Figure 14C:
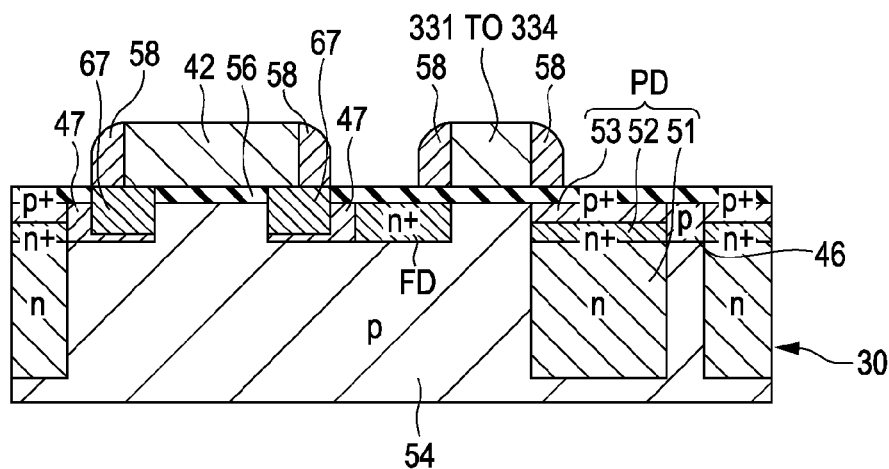

Then, as shown in the process G of FIG. 12 and FIG. 14C, the n-type floating diffusion region FD and the n-type source and drain regions 38 to 41 of the pixel transistors Tr2 to Tr4 are formed by implanting n-type impurity ions.

Then, although not shown in the drawings, in the case where a back-side illumination type CMOS solid-state imaging device is formed, a wire line layer where a plurality of layers of wire lines are arranged in the interlayer insulation film is formed over the surface of the semiconductor substrate 30. For example, a separate silicon substrate, which is a support substrate, is bonded to the wire line layer, and then, the semiconductor substrate is made into a thin film by polishing and etching the back face of the semiconductor substrate 30 up to a desired depth. Then, a p-type semiconductor region for suppressing a dark current is formed on the back face of the substrate, and furthermore, a color filter and an on-chip lens are formed in an insulation film on the back face of the substrate, so that a desired back-side illumination type CMOS solid-state imaging device is obtained.

In the case where the front-side illumination type CMOS solid-state imaging device is formed, a wire line layer obtained by arranging a plurality of layers of wires in the interlayer insulation film is formed over the surface of the semiconductor substrate 30. The wires are formed over the area excluding the photodiode PD. Then, a color filter and an on-chip lens are formed in a planarization film on the wire line layer so that a desired front-side illumination type CMOS solid-state imaging device is obtained.

In the method of manufacturing the solid-state imaging device 65 according to the fourth embodiment of the present invention, the first and second isolation regions 46 and 66 are formed by performing ion implantation two times. Specifically, a first ion implantation process is collectively performed for the photodiode formation area 35 and the pixel transistor formation area 36, and a second ion implantation process is performed only for the photodiode formation area 35. By performing the ion implantation two times, it is possible to form the second isolation region 66 having a low impurity concentration and the first isolation region 46 having a higher concentration that that of the second isolation region 66 but an optimal lower concentration compared to the related art with high precision. Therefore, it is possible to manufacture a CMOS solid-state imaging device with high precision by which a saturation characteristic, conversion efficiency, and a random noise characteristic are improved, generation of white spots in the floating diffusion FD is suppressed, and mixed color is alleviated.

6. Fifth Embodiment

Exemplary Structure of Solid-State Imaging Device

Figure 15:
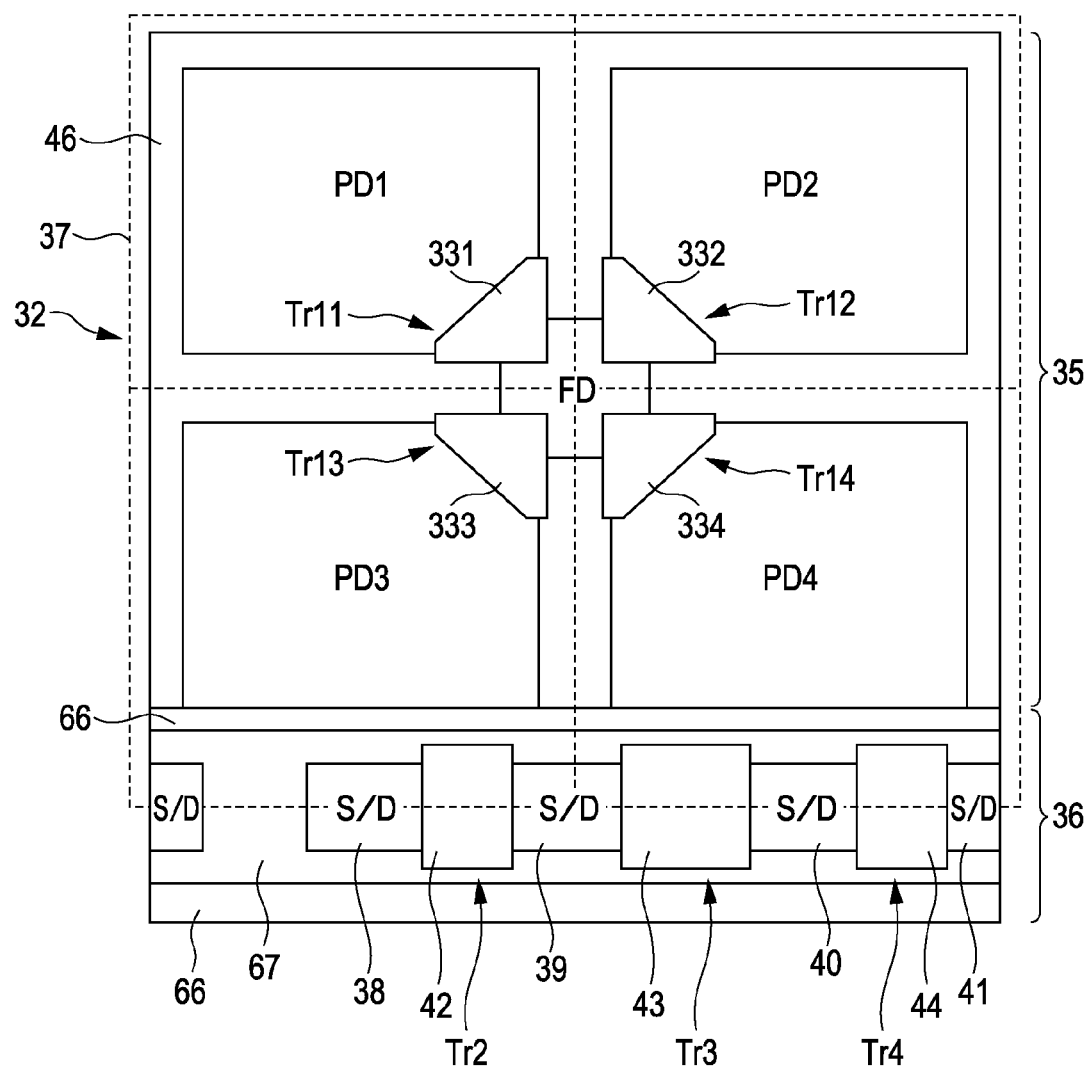
FIG. 15 is a schematic diagram illustrating main components of the solid-state imaging device according to a fifth embodiment of the present invention.

FIG. 15 illustrates the solid-state imaging device according to the fifth embodiment of the present invention. In the present embodiment, as described above, a CMOS solid-state imaging device may be applied in which a so-called 4-pixel sharing unit, where 2 horizontal pixels×2 vertical pixels constitute a unit, is arranged in two dimensions. As shown in FIG. 15, in the solid-state imaging device 69 according to the fifth embodiment of the invention, a pixel portion is constructed by arranging the 4-pixel sharing unit 32 in two dimensions, and the 4-pixel sharing unit 32 is obtained by arranging four photodiodes PD [PD1 to PD4] which are the photoelectric conversion portions of four pixels. In the same manner as FIG. 9, the 4-pixel sharing unit 32 includes the photodiode formation area 35 and the pixel transistor formation area 36. In the photodiode formation area 35, the first isolation region 36 made of a p-type impurity semiconductor layer is formed. In the pixel transistor formation area, the third isolation region 67 with an STI structure surrounding the pixel transistors Tr2 to Tr4 and the second isolation region 66 made of a p-type impurity semiconductor layer between the third isolation region 67 and the photodiode PD are formed.

In the present embodiment, the photodiode formation area 35 and the pixel transistor formation area 36 are separated and an optimal dose amount of p-type impurity ions is implanted so that the first and second isolation regions 46 and 47 are formed to have an optimal concentration. That is, the first isolation region 46 having an optimal low concentration is formed between the photodiodes PD of the photodiode formation area 35. The second isolation region 66 having a concentration that is lower than that of the first isolation region 46 is formed between the third isolation 67 with an STI structure of the pixel transistor formation area 36 and the photodiode PD of the photodiode formation area 35.

Other structures are similar to those of the fourth embodiment. In FIG. 15, like reference numerals denote like elements as in FIG. 9, and a description thereof will be omitted.

In the solid-state imaging device 69 according to the fifth embodiment of the present invention, the impurity concentration of the first isolation region 46 between the photodiodes PD within the photodiode formation area 46 becomes an optimal low concentration. In addition, the third isolation region 67 with an STI structure surrounding the pixel transistors Tr2 to Tr4 is formed within the pixel transistor formation area 36, and second isolation region 66 surrounding the third isolation region 67 has a concentration that is lower than that of the first isolation region 46. Therefore, although a description is not repeated, in the same manner as the fourth embodiment, it is possible to improve a saturation characteristic, i.e., a saturation charge amount QS and sensitivity. It is possible to suppress generation of white spots in the floating diffusion region FD. It is possible to improve conversion efficiency. Furthermore, since the center of the photodiode PD can be closer to the optical center of the pixel by increasing the area of the photodiode, it is possible to alleviate mixed color. It is possible to improve a random noise characteristic.

Further, since the pixel transistors Tr2 to Tr4 are separated by the third isolation region 67 with an STI structure in the pixel transistor formation area 36, it is possible to suppress generation of current leakage between the source and drain regions 38 to 41 so as to guarantee element isolation.

Exemplary Method of Manufacturing Solid-State Imaging Device

A method of manufacturing the solid-state imaging device 69 according to the fifth embodiment of the present invention includes a process of forming a pixel including a photodiode PD and pixel transistors Tr1 to Tr4, i.e., a 4-pixel sharing unit, and a process of forming the third isolation region 67. In addition, the method includes a process of forming the first isolation region 46 and a process of forming the second isolation region 66. The present embodiment is similar to the fourth embodiment described above except that ion implantation processes for the first isolation region and the second isolation region are separately performed. In regard to the manufacturing process shown in FIGS. 12 and 13A to 14C, according to the fifth embodiment of the present invention, in the process E of FIG. 12 and FIG. 14A, for example, ions are implanted only to the photodiode formation area 35 through the first ion implantation process to form the first isolation region 46 having an optimal concentration. Then, ions are implanted only to the pixel transistor formation area 36 through the second ion implantation process to form the second isolation region 66 having a concentration that is lower than that of the first isolation region 46. Alternatively, the second isolation region 66 may be formed through the first ion implantation process, and the first isolation region 46 may be formed through the second ion implantation process. Other processes are similar to those shown in FIGS. 12 and 13A to 14C.

In the method of manufacturing the solid-state imaging device 69 according to the fifth embodiment of the present invention, in the same manner as the fourth embodiment, it is possible to manufacture the CMOS solid-state imaging device with high precision, by which a saturation characteristic, conversion efficiency, and a random noise characteristic are improved, generation of white spots in the floating diffusion FD is suppressed, and mixed color is alleviated.

7. Sixth Embodiment

Exemplary Structure of Solid-State Imaging Device

Figure 16:
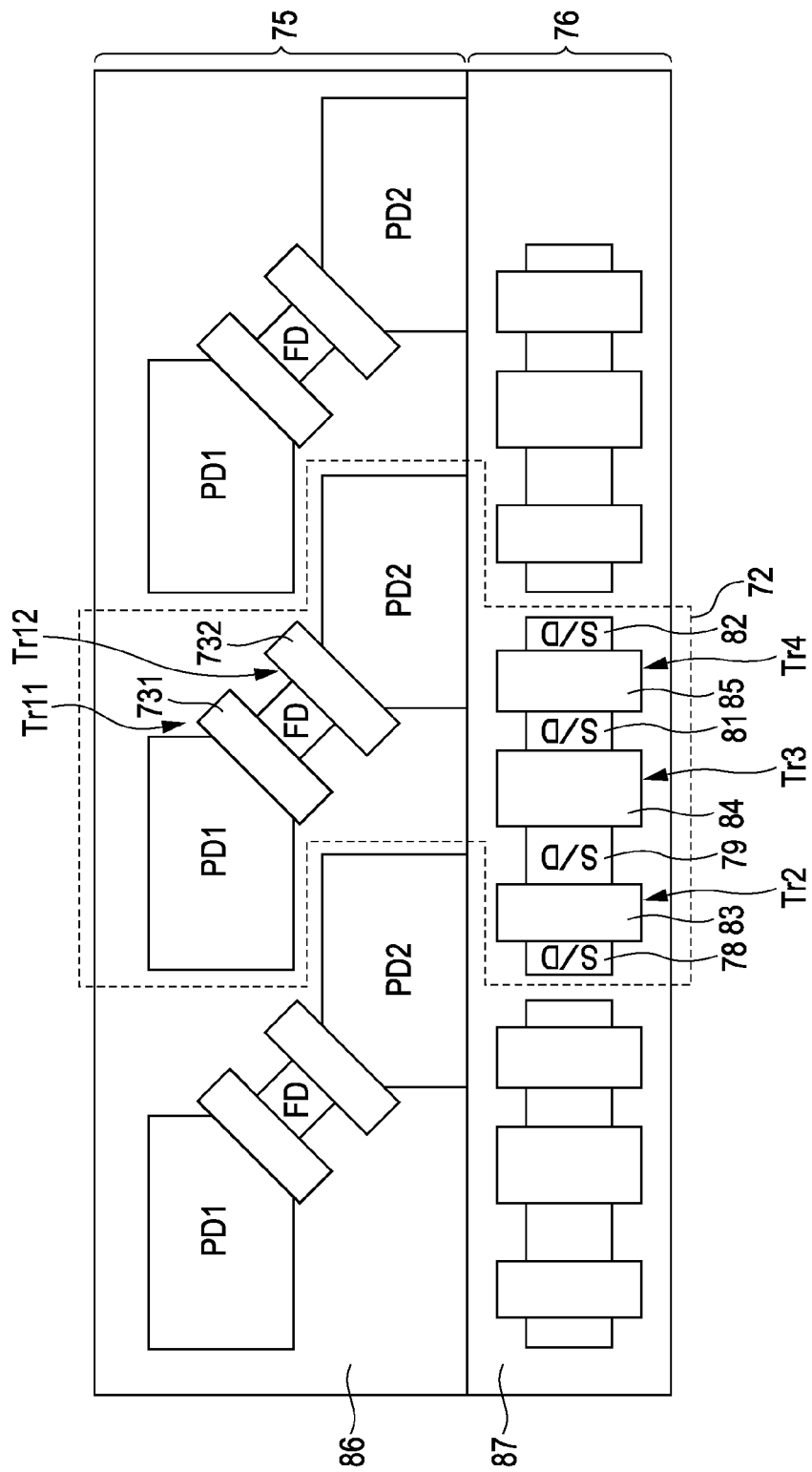
FIG. 16 is a schematic diagram illustrating main components of the solid-state imaging device according to a sixth embodiment of the present invention.

FIG. 16 illustrates a solid-state imaging device according to a sixth embodiment of the present invention. In the present embodiment, a CMOS solid-state imaging device may be applied in which a so-called 2-pixel sharing unit, where two pixels constitute a unit, is arranged in two dimensions. As shown in FIG. 16, in the solid-state imaging device 71 according to the sixth embodiment of the invention, a pixel portion is constructed by arranging the 2-pixel sharing unit 72 in two dimensions, and the 2-pixel sharing unit 72 is obtained by arranging photodiodes PD [PD1 and PD2] which are the photoelectric conversion portions of two pixels. In the 2-pixel sharing unit 72, a single floating diffusion region FD is shared by two photodiodes PD1 and PD2. The pixel transistor includes two transfer transistors Tr1 [Tr11 and Tr12] in addition to a single reset transistor Tr2, a single amplification transistor Tr3, and a single selection transistor Tr4 that are shared. In the present example, while the pixel transistors are a 4-transistor structure, a 3-transistor structure may be used.

The two photodiodes PD1 and PD2 are arranged, for example, in an inclined direction, and the floating diffusion region FD is arranged in the center between the two photodiodes PD1 and PD2. The transfer transistors Tr11 and Tr12 each include the transmission gate electrodes 73 [731 and 732], arranged between the shared floating diffusion region FD and the corresponding photodiodes PD1 and PD2.

Here, the area, which includes the photodiodes PD1 and PD2, the floating diffusion region FD, and the transfer transistors Tr11 and Tr12 of the 2-pixel sharing unit of each row, is the photodiode formation area 75. In addition, out of the pixel transistors of 2-pixel sharing unit of each row, the area, which includes the reset transistor Tr2, the amplification transistor Tr3, and the selection transistor Tr4 shared by the two pixels, is the pixel transistor formation area 76. The photodiode formation area 75 and the pixel transistor formation area 76 which are continuous in a horizontal direction are alternately arranged in the vertical direction of the pixel portion.

The reset transistor Tr2 includes a pair of source and drain regions 78 and 79 and a reset gate electrode 82. The amplification transistor Tr3 includes a pair of source and drain regions 79 and 80 and an amplification gate electrode 83. The selection transistor Tr4 includes a pair of source and drain regions 80 and 81 and a selection gate electrode 84. The floating diffusion region FD and the source and drain regions 38 to 41 are formed from the n-type semiconductor region.

In the present embodiment, both the first isolation region 86 for isolating the photodiode PD within the photodiode formation area 75 and the second isolation region 87 surrounding the pixel transistors Tr2 to Tr4 within the pixel transistor formation area 76 are formed by the p-type impurity semiconductor layer.

The impurity concentrations of the first and second isolation regions 86 and 87 are set to different values, each of which is optimal, as described in the first embodiment. That is, the impurity concentration of the first isolation region 86 is set to a low concentration sufficient to isolate between the photodiodes PD. On the other hand, the impurity concentration of the second isolation region 87 is set to a high concentration sufficient to isolate between the source and drain regions 38 and 41 having a high impurity concentration of the pixel transistors Tr2 to Tr4, i.e., an impurity concentration higher than that of the first isolation region 86.

The solid-state imaging device 71 according to an embodiment of the present invention may be constructed as the back-side illumination type CMOS solid-state imaging device or the front-side illumination type CMOS solid-state imaging device.

In the solid-state imaging device 71 according to the sixth embodiment of the invention, similar effects to those of the first embodiment described above can be obtained. For example, a saturation characteristic, sensitivity, and conversion efficiency are improved, generation of white spots in the floating diffusion FD is suppressed, and mixed color is alleviated.

The structures and the manufacturing methods described in the first, second, and third embodiments may also be applied to the structures and the manufacturing methods of the first and second isolation regions 86 and 87 of the solid-state imaging device according to the sixth embodiment of the invention.

8. Seventh Embodiment

Exemplary Structure of Solid-State Imaging Device

Figure 17:
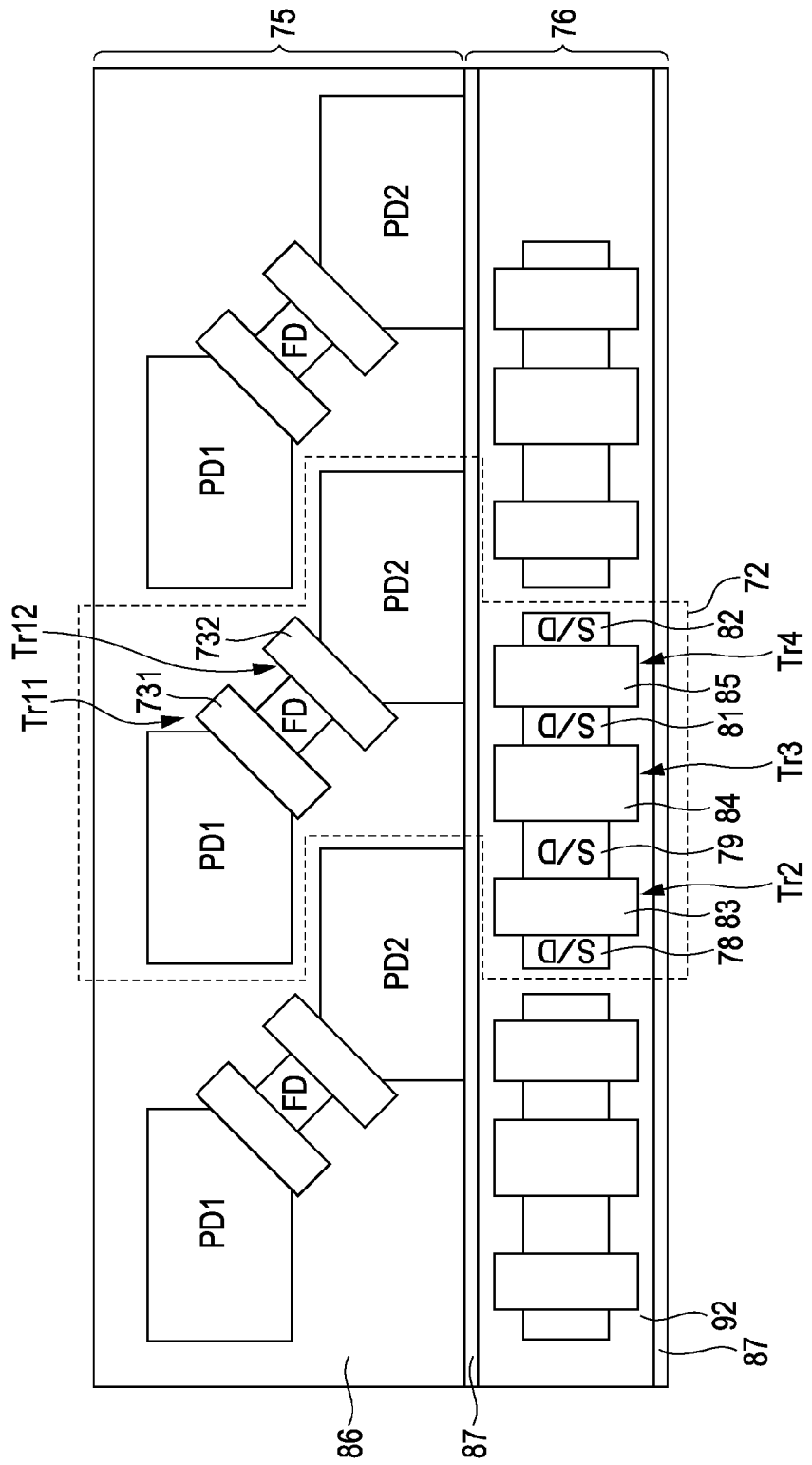
FIG. 17 is a schematic diagram illustrating main components of the solid-state imaging device according to a seventh embodiment of the present invention.

FIG. 17 illustrates a solid-state imaging device according to a seventh embodiment of the present invention. In the present embodiment, in the same manner as the sixth embodiment, a CMOS solid-state imaging device may be applied in which a so-called 2-pixel sharing unit, where two pixels constitutes a unit, is arranged in two dimensions. As shown in FIG. 17, in the solid-state imaging device 89 according to the seventh embodiment of the invention, a pixel portion is constructed by arranging the 2-pixel sharing unit 72 in two dimensions, and the 2-pixel sharing unit 72 is obtained by arranging photodiodes PD [PD1 and PD2] which are the photoelectric conversion portions of two pixels. The 2-pixel sharing unit 72 includes the photodiode formation area 75 and the pixel transistor formation area 76 as described above.

In the present embodiment, as described in the fourth embodiment, the first isolation region 86 made of a p-type impurity semiconductor layer is formed between the neighboring photodiodes PD within the photodiode formation area 75. In addition, within the pixel transistor formation area 76, the third isolation region 97 with an STI structure surrounding the pixel transistors Tr2 to Tr4 and the second isolation region 96 made of a p-type semiconductor layer between the third isolation region 97 and the photodiode PD are formed. The second isolation region 96 has an impurity concentration that is lower than that of the first isolation region 86.

Other structures are similar to those of the sixth embodiment. In FIG. 17, like reference numerals denote like elements as in FIG. 16, and a description thereof will be omitted.

In the solid-state imaging device 89 according to the seventh embodiment of the invention, similar effects to those of the fourth embodiment described above can be obtained. For example, a saturation characteristic, sensitivity, and conversion efficiency are improved, generation of white spots in the floating diffusion FD is suppressed, and mixed color is alleviated.

The structures and the manufacturing methods described in the fourth and fifth embodiments may also be applied to the structures and the manufacturing methods of the first, second, and third isolation regions 86, 96, and 97 of the solid-state imaging device according to the seventh embodiment of the invention.

In the aforementioned examples, as the pixel sharing solid-state imaging device, the 4-pixel sharing or 2-pixel sharing CMOS solid-state imaging device has been described. The present invention may also be applied to other pixel sharing CMOS solid-state imaging devices. For example, the present invention may be applied to a CMOS solid-state imaging device sharing horizontal two pixels by vertical 2n pixels (where, n is any positive integer number).

9. Eighth Embodiment

Exemplary Structure of Solid-State Imaging Device

Figure 18:
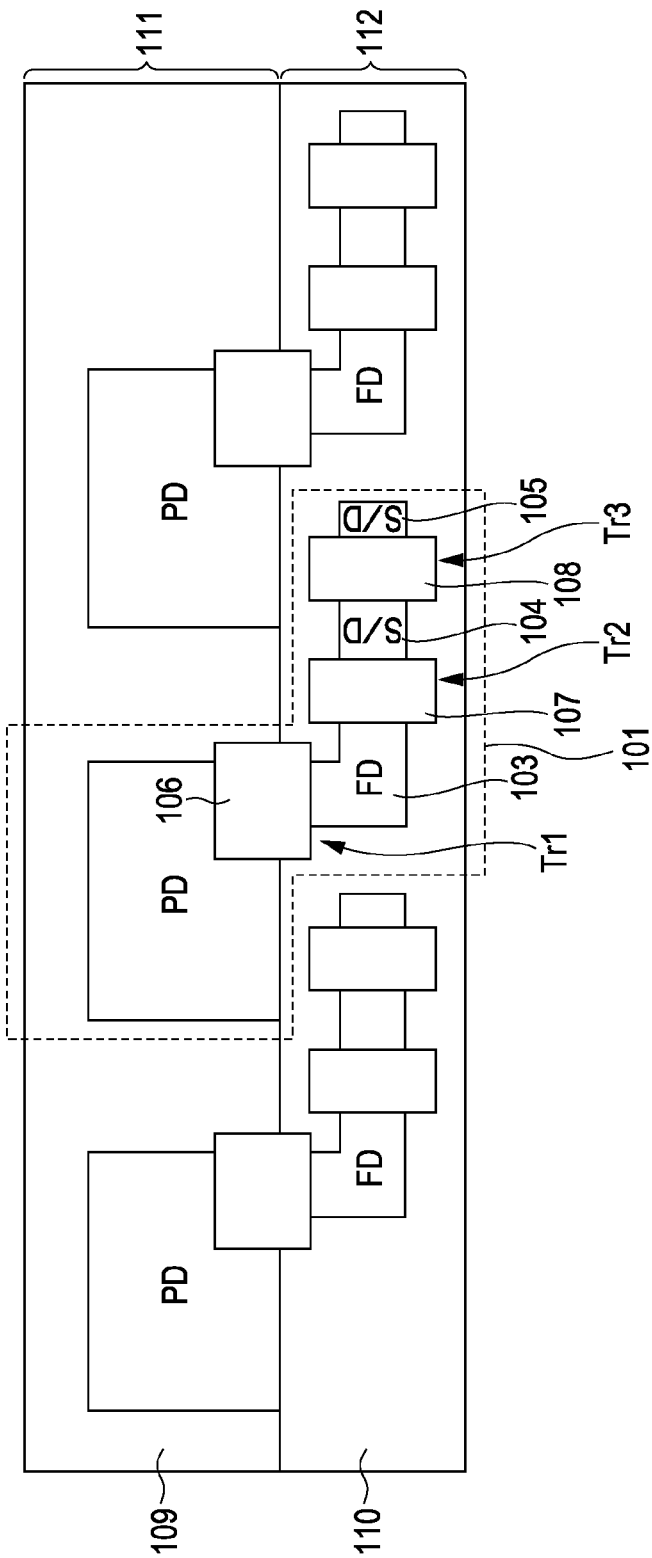
FIG. 18 is a schematic diagram illustrating main components of the solid-state imaging device according to an eighth embodiment of the present invention.

FIG. 18 illustrates a solid-state imaging device according to an eighth embodiment of the present invention. In the present embodiment, a CMOS solid-state imaging device may be applied in which unit pixels are arranged in two dimensions. In the solid-state imaging device 99 according to the eighth embodiment of the invention, a pixel portion is constructed by arranging unit pixels 101 in two dimensions, and each unit pixel 101 includes a single photodiode PD and a plurality of pixel transistors including a single floating diffusion region FD. In the present example, a plurality of pixel transistors has a 3-transistor structure including a transfer transistor Tr1, a reset transistor Tr2, and an amplification transistor Tr3. A 4-transistor structure with the selection transistor Tr4 added may be used.

The transfer transistor Tr1 includes a photodiode PD, an n-type source/drain region 103 corresponding to the floating diffusion region FD, and a transmission gate electrode 106. The reset transistor Tr2 includes a pair of n-type source and drain regions 103 and 104 and a reset gate electrode 107. The amplification transistor Tr3 includes a pair of n-type source and drain regions 104 and 105 and an amplification gate electrode 108.

Here, the area including the photodiode PD of each row is the photodiode formation area 111. The area including the pixel transistors Tr1 to Tr3 of each row is the photodiode formation area 112. The pixel transistor formation area 112 and the photodiode formation area 111 extending in the horizontal direction are alternately arranged in the horizontal direction of the pixel region.

In the present embodiment, the first isolation region 109 for isolating the photodiode PD within the photodiode formation area 111 and the second isolation region 110 surrounding the pixel transistors Tr2 to Tr4 within the pixel transistor formation area 112 are formed by the p-type impurity semiconductor layer.

The impurity concentrations of the first and second isolation regions 109 and 110 are set to different values, each of which is optimal, as described in the first embodiment. That is, the impurity concentration of the first isolation region 109 is set to a low concentration sufficient to isolate between the photodiodes PD. On the other hand, the impurity concentration of the second isolation region 110 is set to a high concentration sufficient to isolate between the source and drain regions 103 to 105 having a high impurity concentration of the pixel transistors Tr1 to Tr3, i.e., an impurity concentration higher than that of the first isolation region 109.

The solid-state imaging device 99 according to an embodiment of the present invention may be constructed as the back-side illumination type CMOS solid-state imaging device or the front-side illumination type CMOS solid-state imaging device.

In the solid-state imaging device 99 according to the eighth embodiment of the invention, it is possible to improve a saturation characteristic and sensitivity, and alleviate mixed color.

The structures and the manufacturing methods described in the first, second, and third embodiments may also be applied to the structures and the manufacturing methods of the first and second isolation regions 109 and 110 of the solid-state imaging device according to the eighth embodiment of the invention.

10. Ninth Embodiment

Exemplary Structure of Solid-State Imaging Device

Figure 19:
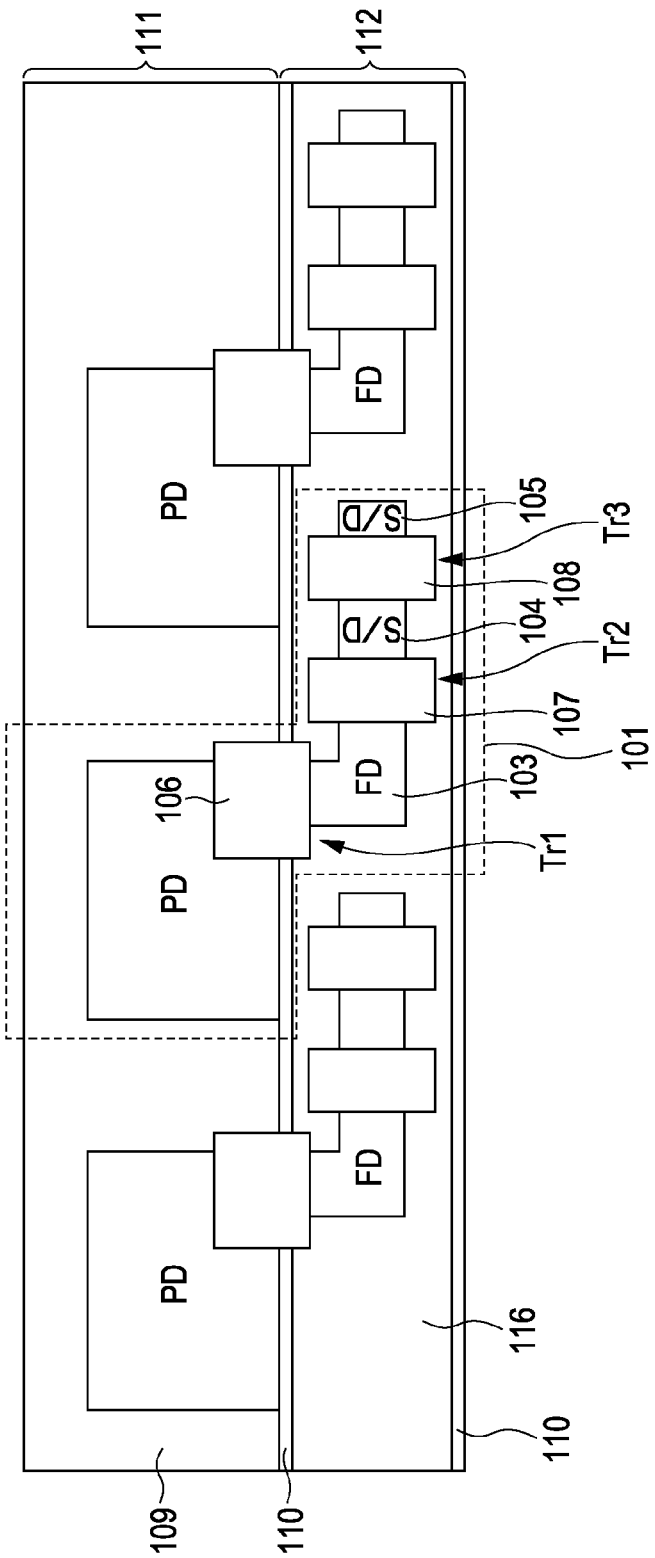
FIG. 19 is a schematic diagram illustrating main components of the solid-state imaging device according to a ninth embodiment of the present invention.

FIG. 19 illustrates a solid-state imaging device according to a ninth embodiment of the present invention. In the present embodiment, in the same manner as the eighth embodiment, a CMOS solid-state imaging device may be applied in which unit pixels are arranged in two dimensions. In the solid-state imaging device 115 according to the ninth embodiment of the invention, a pixel portion is constructed by arranging unit pixels 101 in two dimensions, and each unit pixel 101 includes a single photodiode PD and a plurality of pixel transistors including a single floating diffusion region FD. The unit pixel 101 includes the photodiode formation area 111 and the pixel transistor formation area 112 as described above.

In the present embodiment, the first isolation region 111 made of a p-type impurity semiconductor layer is formed between the neighboring photodiodes PD within the photodiode formation area 111. In addition, within the pixel transistor formation area 112, the third isolation region 116 with an STI structure surrounding the pixel transistors Tr1 to Tr3 and the second isolation region 110 made of a p-type semiconductor layer between the third isolation region 116 and the photodiode PD are formed. The second isolation region 110 has an impurity concentration that is lower than that of the first isolation region 109.

Other structures are similar to those of the eighth embodiment. In FIG. 19, like reference numerals denote like elements as in FIG. 18, and a description thereof will be omitted.

In the solid-state imaging device 115 according to the ninth embodiment of the invention, it is possible to improve a saturation characteristic and sensitivity, and alleviate mixed color.

The structures and the manufacturing methods described in the fourth and fifth embodiments may also be applied to the structures and the manufacturing methods of the first, second, and third isolation regions 109, 110, and 116 of the solid-state imaging device according to the ninth embodiment of the invention.

As another embodiment of the present invention, the isolation region for isolating between the photodiodes PD of the pixel portion and the isolation region for isolating between the MOS transistors of the peripheral circuit portion may be constructed using the isolation structures described in the aforementioned embodiments. That is, the structures of the first and second isolation regions or the structures of the first, second, and third isolation regions may be employed.

As still another embodiment of the present invention, a CCD solid-state imaging device may be employed. In this case, the solid-state imaging device is constructed such that the photodiodes are arranged in two dimensions, and charges from the photodiodes in two neighboring columns are read by a vertical transmission register disposed in both sides. In addition, as a channel stop region corresponding to the isolation region, the channel stop region between the photodiodes in two neighboring columns has an impurity concentration that is lower than that of the channel stop region between the photodiode and the vertical transmission register.

In the CCD solid-state imaging device according to the present embodiment, it is possible to increase the area of the photodiode by means of the channel stop region having a low impurity concentration. Therefore, it is possible to further improve a saturation characteristic and sensitivity.

While electrons are used as a signal charge in the aforementioned solid-state imaging device, a solid-state imaging device may be used where holes are used as a signal charge. In this case, the conductivity types of each semiconductor region are reversed.

11. Tenth Embodiment

Exemplary Structure of Electronic Apparatus

The solid-state imaging device according to the aforementioned embodiments of the invention may be applied to, for example, camera systems such as a digital camera or a video camera, or electronic apparatuses such as a mobile phone with an imaging function or other devices with an imaging functions.

Figure 24:
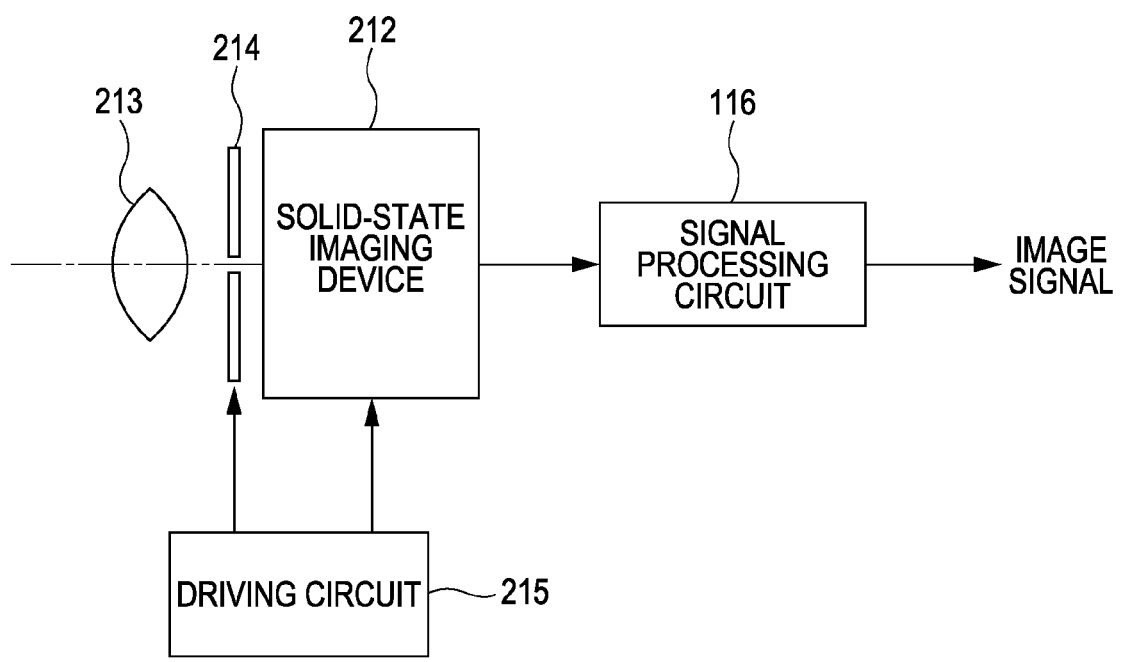
FIG. 24 is a schematic diagram illustrating main components of an electric device according to a tenth embodiment of the present invention.

FIG. 24 illustrates a camera used as an example of the electronic apparatus according to a tenth embodiment of the invention. As the camera of the present embodiment, a video camera capable of photographing a still image or a moving picture is exemplified. The camera 211 according to the present embodiment includes a solid-state imaging device 212, an optical system 213 that guides incident light to a light sensing sensor portion of the solid-state imaging device 212, and a shutter device 214. Furthermore, the camera 211 includes a driving circuit 215 for driving the solid-state imaging device 212 and a signal processing circuit 116 for processing an output signal from the solid-state imaging device 212.

As the solid-state imaging device 212, any one of the CMOS solid-state imaging devices described in the aforementioned embodiments can be used. Particularly, it is preferable that the pixel sharing back-side illumination type CMOS solid-state imaging device is employed as the solid-state imaging device 212. The optical system (optical lenses) 213 focuses the image light (incident light) from a subject on an imaging plane of the solid-state imaging device 212. As a result, signal charges are accumulated in the solid-state imaging device 212 for a certain period of time. The optical system 213 may be an optical lens system including a plurality of optical lenses. The shutter device 214 controls a light illumination period and a light blocking period of the solid-state imaging device 212. The driving circuit 215 supplies a driving signal for controlling the shutter operation of the shutter device 214 and the transmission operation of the solid-state imaging device 212. Signal transmission of the solid-state imaging device 212 is performed based on the driving signal (timing signal) supplied from the driving circuit 215. The signal processing circuit 216 performs various signal processing operations. The image signal subjected to the signal processing is stored in a storage medium such as a memory or is output to a monitor.

In the electronic apparatus such as a camera according to the tenth embodiment of the invention, even when the pixel in the solid-state imaging device 212 becomes finer, it is possible to improve pixel characteristics such as a saturation characteristic. Therefore, a high-quality electronic apparatus can be provided with an improved image quality.

The present application contains subject matter related to that disclosed in Japanese Priority Patent Application JP 2009-272440 filed in the Japan Patent Office on Nov. 30, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising: a pixel having a photodiode and a pixel transistor; a first isolation region using a semiconductor region containing impurities formed between neighboring photodiodes; and a second isolation region using a semiconductor region containing impurities formed between the photodiode and the pixel transistor, wherein the second isolation region is in contact with the photodiode and the pixel transistor, and wherein an impurity concentration of the first isolation region is different from an impurity concentration of the second isolation region.

2. The solid-state imaging device according to claim 1, wherein the impurity concentration of the first isolation region is lower than the impurity concentration of the second isolation region.

3. The solid-state imaging device according to claim 1, wherein a third isolation region using an STI structure is provided between the second isolation region and the pixel transistor, and the impurity concentration of the second isolation region is lower than the impurity concentration of the first isolation region.

4. The solid-state imaging device according to any one of claims 1 to 3, wherein the pixel includes a pixel sharing unit where a plurality of photodiodes shares a single pixel transistor group excluding a transfer transistor.

5. The solid-state imaging device according to any one of claims 1 to 3, wherein the pixel include a unit pixel having a photodiode and a plurality of pixel transistors.

6. A solid-state imaging device comprising: a pixel having a photodiode and a pixel transistor; a first isolation region using a semiconductor region containing impurities formed between neighboring photodiodes; and a second isolation region using a semiconductor region containing impurities formed between the photodiode and the pixel transistor,
wherein, an impurity concentration of the first isolation region is different from an impurity concentration of the second isolation region, wherein the impurity concentration of the first isolation region is lower than the impurity concentration of the second isolation region, and
wherein the second isolation region is formed between a source/drain region of the pixel transistor and the photodiode, and the first isolation region extends between a gate electrode of the pixel transistor and the photodiode.

7. A method of manufacturing a solid-state imaging device, the method comprising the steps of: forming a pixel including a photodiode and a pixel transistor; forming a first isolation region using a semiconductor region containing impurities between neighboring photodiodes; and forming a second isolation region having an impurity concentration different from that of the first isolation region between the photodiode and the pixel transistor, wherein the second isolation region is in contact with the photodiode and the pixel transistor.

8. The method according to claim 7, further comprising the steps of: forming the first isolation region by collectively performing a first impurity ion implantation process for a gap between the neighboring photodiodes and a gap between the photodiode and the pixel transistor; and forming the second isolation region having a higher impurity concentration that that of the first isolation region by performing a second impurity ion implantation between the photodiode and the pixel transistor.

9. The method according to claim 7, further comprising a step of forming the first isolation region and the second isolation region having an impurity concentration higher than that of the first isolation region by separately performing impurity ion implantation between the neighboring photodiodes and impurity ion implantation between the photodiode and the pixel transistor.

10. The method according to claim 7, further comprising the steps of: forming a third isolation region with an STI structure for isolating between the photodiode and the pixel transistor; and forming the first isolation region by implanting impurity ions between the neighboring photodiodes and forming the second isolation region having an impurity concentration lower than that of the first isolation region between the third isolation region and the photodiode.

11. The method according to any one of claims 7 to 10, wherein the pixel is formed as a pixel sharing unit in which a plurality of photodiodes shares a single pixel transistor group other than a transfer transistor.

12. The method according to any one of claims 7 to 10, wherein the pixel is formed as a unit pixel including a photodiode and a plurality of pixel transistors.

13. A method of manufacturing a solid-state imaging device, the method comprising the steps of: forming a pixel including a photodiode and a pixel transistor; forming a first isolation region using a semiconductor region containing impurities between neighboring photodiodes; and forming a second isolation region having an impurity concentration different from that of the first isolation region between the photodiode and the pixel transistor,
further comprising the steps of: forming the first isolation region by collectively performing a first impurity ion implantation process for a gap between the neighboring photodiodes and a gap between the photodiode and the pixel transistor; and forming the second isolation region having a higher impurity concentration that that of the first isolation region by performing a second impurity ion implantation between the photodiode and the pixel transistor,
wherein the second impurity ion implantation process is performed for a gap between the photodiode and a source/drain region excluding a gap between the photodiode and the gate electrode of the pixel transistor to form the second isolation region between the photodiode and the source/drain region.

14. An electronic apparatus comprising: (a) a solid-state imaging device comprising (1) a pixel having a photodiode and a pixel transistor, (2) a first isolation region using a semiconductor region containing impurities formed between neighboring photodiodes, and (3) a second isolation region using a semiconductor region containing impurities formed between the photodiode and the pixel transistor, wherein the second isolation region is in contact with the photodiode and the pixel transistor, an impurity concentration of the first isolation region being different from an impurity concentration of the second isolation region: (b) an optical system that guides incident light to a photodiode of the solid-state imaging device; and (c) a signal processing circuit that processes an output signal from the solid-state imaging device.

* * * * *